US012638067B2

(12) United States Patent
Crump et al.

(10) Patent No.: US 12,638,067 B2
(45) Date of Patent: May 26, 2026

(54) COMPLIANT FACE OF A CHAIN MOTION CONTROL DEVICE TO INFLUENCE CHAIN SYSTEM NOISE, VIBRATION AND HARSHNESS PERFORMANCE

(71) Applicant: BorgWarner, Inc., Auburn Hills, MI (US)

(72) Inventors: Matthew W. Crump, Cortland, NY (US); Christopher Van Loon, Ithaca, NY (US); Joseph P. Goodsell, Groton, NY (US)

(73) Assignee: BorgWarner, Inc., Auburn Hills, MI (US)

( * ) Notice: Subject to any disclaimer, the term of this patent is extended or adjusted under 35 U.S.C. 154(b) by 986 days.

(21) Appl. No.: 17/864,789

(22) Filed: Jul. 14, 2022

(65) Prior Publication Data

US 2024/0026956 A1     Jan. 25, 2024

(51) Int. Cl.
F16H 7/08      (2006.01)
G06F 30/17     (2020.01)
G06F 30/20     (2020.01)

(52) U.S. Cl.
CPC ........... F16H 7/0838 (2013.01); G06F 30/17 (2020.01); G06F 30/20 (2020.01);
(Continued)

(58) Field of Classification Search
CPC ........... F16H 7/0838; F16H 2007/0842; F16H 2007/0861; F16H 2007/0872;
(Continued)

(56) References Cited

U.S. PATENT DOCUMENTS 1,579,681 A     4/1926   John
1,892,067 A     12/1932  Douglas
(Continued)

FOREIGN PATENT DOCUMENTS

CN        2859091        1/2007
CN        109667898 A    4/2019
(Continued)

OTHER PUBLICATIONS

Bonart, Jakob et al., "Enhancing End-of-Line Defect Classifications and Evaluating Early Testability for Inline Test Stands Using NVH Measurements", 2021, IEEE. (Year: 2021).
(Continued)

*Primary Examiner* — Chuen-Meei Gan
(74) *Attorney, Agent, or Firm* — Brown & Michaels, PC

(57)      ABSTRACT

Tensioning devices with at least a portion of the tensioner face incorporating increased compliance of at least two pitch lengths in distance that meets compliance geometry requirements and applied force tensioner face stiffness requirements to decrease NVH through the incorporation of a cavity within the body of the tensioning deice, incorporation of a blade spring within the cavity of the tensioning device, incorporation of an elastomer within the cavity of the tensioning device, locating a compliance portion of the tensioner face at one end of the tensioner face of the tensioning device, and a spring utilized as a tensioning device with an elastomer face.

13 Claims, 24 Drawing Sheets
(13 of 24 Drawing Sheet(s) Filed in Color)

(52) U.S. Cl.
CPC ................ *F16H 2007/0842* (2013.01); *F16H 2007/0861* (2013.01); *F16H 2007/0872* (2013.01); *F16H 2007/0893* (2013.01); *F16H 2007/0897* (2013.01)

(58) Field of Classification Search
CPC ..... F16H 2007/0893; F16H 2007/0897; F16H 7/08; F16H 2007/0804; F16H 7/06; F16H 2007/087; G06F 30/17; G06F 30/20; F16G 13/02; F16G 15/12
See application file for complete search history.

(56) References Cited

U.S. PATENT DOCUMENTS

| | | | |
|---|---|---|---|
| 2,129,107 A | 9/1938 | Taylor | |
| 2,191,946 A | 2/1940 | John | |
| 2,210,276 A | 8/1940 | Bremer | |
| 2,355,003 A | 8/1944 | Mccann | |
| 2,601,789 A | 7/1952 | Riopelle | |
| 2,766,634 A | 10/1956 | Frank | |
| 3,334,524 A | 8/1967 | Chalk | |
| 3,441,009 A | 4/1969 | Rafanelli | |
| 3,455,178 A | 7/1969 | Ruoff et al. | |
| 3,656,361 A | 4/1972 | Honda | |
| 3,673,884 A | 7/1972 | Southiere | |
| 3,817,113 A | 6/1974 | Pfarrwaller | |
| 4,069,719 A | 1/1978 | Cancilla | |
| 4,337,055 A | 6/1982 | Mackay et al. | |
| 4,457,741 A | 7/1984 | Hoeptner, III | |
| 4,662,862 A | 5/1987 | Matson | |
| 4,869,708 A | 9/1989 | Hoffmann et al. | |
| 5,000,724 A | 3/1991 | Reid | |
| 5,049,114 A | 9/1991 | Hayden | |
| 5,122,098 A | 6/1992 | Kanehira | |
| 5,180,340 A | 1/1993 | Vahabzadeh et al. | |
| 5,234,381 A | 8/1993 | Vahabzadeh et al. | |
| 5,286,234 A | 2/1994 | Young | |
| 5,306,212 A | 4/1994 | Eberle | |
| 5,320,582 A | 6/1994 | Takeda | |
| 5,445,568 A | 8/1995 | Fukuzawa et al. | |
| 5,524,725 A | 6/1996 | Schantzen | |
| 5,730,674 A | 3/1998 | Ott | |
| 5,776,024 A | 7/1998 | White et al. | |
| 5,797,818 A | 8/1998 | Young | |
| 5,846,150 A | 12/1998 | Wigsten | |
| 5,938,551 A | 8/1999 | Warner | |
| 5,961,411 A | 10/1999 | Tsutsumi et al. | |
| 5,967,922 A | 10/1999 | Ullein et al. | |
| 6,062,998 A | 5/2000 | Kumakura et al. | |
| 6,117,034 A | 9/2000 | Vine | |
| 6,129,644 A | 10/2000 | Inoue | |
| 6,240,887 B1 | 6/2001 | Tosaka et al. | |
| 6,302,816 B1 | 10/2001 | Wigsten | |
| 6,322,470 B1 | 11/2001 | Markley et al. | |
| 6,358,169 B1 * | 3/2002 | Markley ................... | F16H 7/08 474/140 |
| 6,375,587 B1 | 4/2002 | Wigsten | |
| 6,412,464 B1 | 7/2002 | Schneider et al. | |
| 6,440,020 B1 | 8/2002 | Tada | |
| 6,572,502 B1 | 6/2003 | Young et al. | |
| 6,599,209 B1 | 7/2003 | Ullein et al. | |
| 6,849,015 B2 | 2/2005 | Markley et al. | |
| 7,063,635 B2 | 6/2006 | Garcia | |
| 7,476,168 B2 * | 1/2009 | Markley ................... | F16H 7/18 474/111 |
| 7,597,640 B2 | 10/2009 | Markley et al. | |
| 7,641,577 B2 | 1/2010 | Markley et al. | |
| 8,007,386 B2 * | 8/2011 | Smart ................... | F16H 7/0831 474/111 |
| 8,348,792 B2 | 1/2013 | He | |
| 8,900,079 B2 | 12/2014 | Mori et al. | |
| 9,482,336 B2 | 11/2016 | Utaki | |
| 9,534,516 B2 | 1/2017 | Utaki | |
| 9,759,292 B2 | 9/2017 | Moura et al. | |

| | | | |
|---|---|---|---|
| 9,797,483 B2 | 10/2017 | Kurono et al. | |
| 10,017,204 B2 | 7/2018 | Kim | |
| 10,054,213 B1 | 8/2018 | Alexiou et al. | |
| 10,487,921 B2 | 11/2019 | Voges | |
| 10,612,630 B2 | 4/2020 | Konno et al. | |
| 11,796,040 B2 | 10/2023 | Crump et al. | |
| 12,078,245 B2 * | 9/2024 | Crump .................. | F16H 7/0829 |
| 2002/0042316 A1 | 4/2002 | Young, Jr. et al. | |
| 2002/0045503 A1 | 4/2002 | Young et al. | |
| 2002/0115511 A1 | 8/2002 | Tada | |
| 2002/0160868 A1 | 10/2002 | Wigsten et al. | |
| 2003/0062015 A1 | 4/2003 | Garza | |
| 2003/0228948 A1 | 12/2003 | Garbagnati et al. | |
| 2004/0005952 A1 | 1/2004 | Bachmair | |
| 2004/0067806 A1 | 4/2004 | Markley et al. | |
| 2005/0075204 A1 | 4/2005 | Cholewczynski | |
| 2005/0085322 A1 | 4/2005 | Markley | |
| 2005/0107196 A1 | 5/2005 | Konno et al. | |
| 2006/0100047 A1 | 5/2006 | Churchill et al. | |
| 2006/0270502 A1 | 11/2006 | Markley et al. | |
| 2006/0293134 A1 | 12/2006 | Markley et al. | |
| 2007/0093328 A1 | 4/2007 | Markley | |
| 2008/0070731 A1 | 3/2008 | Vrsek et al. | |
| 2009/0111629 A1 | 4/2009 | Kobara et al. | |
| 2009/0143177 A1 | 6/2009 | Nakano et al. | |
| 2009/0156339 A1 | 6/2009 | Yokoyama | |
| 2009/0205206 A1 | 8/2009 | Markley | |
| 2009/0275430 A1 | 11/2009 | Markley | |
| 2009/0325750 A1 | 12/2009 | Wigsten et al. | |
| 2010/0203991 A1 | 8/2010 | He | |
| 2010/0210384 A1 | 8/2010 | Young et al. | |
| 2010/0248876 A1 | 9/2010 | Kroon et al. | |
| 2011/0077114 A1 | 3/2011 | Markley | |
| 2012/0129636 A1 | 5/2012 | Lee et al. | |
| 2012/0225744 A1 | 9/2012 | Markley | |
| 2013/0059686 A1 | 3/2013 | Markley et al. | |
| 2013/0059687 A1 | 3/2013 | Markley | |
| 2015/0330482 A1 | 11/2015 | Todd et al. | |
| 2016/0084358 A1 | 3/2016 | Yuan | |
| 2016/0102736 A1 | 4/2016 | Suchecki | |
| 2016/0102738 A1 | 4/2016 | Vopelius-Feldt et al. | |
| 2016/0186840 A1 | 6/2016 | Cipollone et al. | |
| 2016/0238104 A1 | 8/2016 | Vroman et al. | |
| 2016/0265632 A1 | 9/2016 | Young et al. | |
| 2017/0009849 A1 | 1/2017 | Stiglmaier et al. | |
| 2017/0108111 A1 | 4/2017 | Steward et al. | |
| 2017/0276216 A1 | 9/2017 | Perissinotto et al. | |
| 2018/0163848 A1 | 6/2018 | Quinn et al. | |
| 2018/0266312 A1 | 9/2018 | Iwagami et al. | |
| 2018/0274674 A1 | 9/2018 | Werny et al. | |
| 2018/0334928 A1 | 11/2018 | Yamauchi et al. | |
| 2019/0003558 A1 | 1/2019 | Kumar et al. | |
| 2019/0071286 A1 | 3/2019 | Dong et al. | |
| 2019/0072175 A1 | 3/2019 | Klar et al. | |
| 2020/0157976 A1 | 5/2020 | Takahashi et al. | |
| 2021/0262552 A1 | 8/2021 | Seki et al. | |
| 2022/0235851 A1 | 7/2022 | Crump et al. | |
| 2022/0235852 A1 | 7/2022 | Crump et al. | |
| 2022/0325783 A1 | 10/2022 | Schroeder et al. | |
| 2023/0104355 A1 | 4/2023 | Pennazza et al. | |
| 2023/0383819 A1 | 11/2023 | Crump et al. | |
| 2023/0407949 A1 | 12/2023 | Crump et al. | |
| 2024/0026956 A1 | 1/2024 | Crump et al. | |

FOREIGN PATENT DOCUMENTS

| | | | |
|---|---|---|---|
| CN | 110030345 A | 7/2019 | |
| DE | 4327314 A1 | 2/1994 | |
| DE | 10014333 A1 | 3/2001 | |
| DE | 102004013207 A1 | 10/2005 | |
| DE | 102004013696 A1 | 10/2005 | |
| DE | 102005004186 A1 | 8/2006 | |
| DE | 102006025890 A1 | 12/2007 | |
| DE | 102006055645 A1 | 5/2008 | |
| DE | 112015002425 | 3/2017 | |
| DE | 112017000089 | 5/2018 | |
| DE | 102020104887 A1 | 8/2021 | |
| EP | 1070875 A3 | 4/2001 | |
| EP | 1164312 A3 | 6/2007 | |

(56) References Cited

FOREIGN PATENT DOCUMENTS

| | | | |
|---|---|---|---|
| EP | 2589773 | A1 | 5/2013 |
| GB | 2206175 | A | 12/1988 |
| JP | S4993493 | U | 8/1974 |
| JP | S5121782 | U | 2/1976 |
| JP | S54133272 | A | 10/1979 |
| JP | S56173248 | | 7/1985 |
| JP | H03134351 | A | 6/1991 |
| JP | H06280608 | A | 10/1994 |
| JP | H07247858 | A | 9/1995 |
| JP | H08184358 | A | 7/1996 |
| JP | 2000274501 | A | 10/2000 |
| JP | 3383825 | B2 | 3/2003 |
| JP | 2003240061 | A | 8/2003 |
| JP | 200428218 | | 1/2004 |
| JP | 2005042757 | A | 2/2005 |
| JP | 2005042779 | A | 2/2005 |
| JP | 2005075122 | A | 3/2005 |
| JP | 2006138471 | A | 6/2006 |
| JP | 2008143249 | A | 6/2008 |
| JP | 2010014044 | A | 1/2010 |
| JP | 201213190 | | 1/2012 |
| JP | 2014066322 | A | 4/2014 |
| JP | 2019120243 | A | 7/2019 |
| WO | 0026532 | A1 | 5/2000 |
| WO | 2020068048 | A1 | 4/2020 |
| WO | 2020157457 | A1 | 8/2020 |
| WO | 2022186336 | A1 | 9/2022 |

OTHER PUBLICATIONS

Conwell, James C. et al., "Design, Construction and Instrumentation of a Machine to Measure Tension and Impact Forces in Roller Chain Drives", Feb. 27, 1995, Mech. Mach. Theory vol. 31, No. 4, Elsevier Science Ltd. (Year: 1995).

* cited by examiner

300 N/mm

FLEXIBLE FACE

SLACK STRAND TENSIONER

Fig. 14

Tensioner Torque Fluctuation (Nm)

0    0.1    0.2

COMPLIANT FACE OF A CHAIN MOTION CONTROL DEVICE TO INFLUENCE CHAIN SYSTEM NOISE, VIBRATION AND HARSHNESS PERFORMANCE

BACKGROUND

The present invention relates to improving noise, vibration and harshness (NVH) performance of a chain motion control device, and more specifically to improving NVH performance of a chain motion control device through a compliant face.

Chain applications, either timing or drivetrain, can require contact between the back of a chain and a tensioner face of a motion control device, such as a tensioner face, arm, guide, or snubber, to control chain motion. The contact between the chain and tensioner face can result in increased NVH, reducing the perceived performance of the chain system. In particular, the chain-to-tensioner face contact forces can align with chain orders, such as pitch frequency, causing additional excitations and unacceptable performance.

Chain applications, either timing or drivetrain can require contact between the back of the chain and the face of a tensioner guide, arm or snubber to control chain motion. The contact between the chain and the face can result in engagement noise which can increase NVH, reducing perceived performance of the chain system. In particular, the chain-to-face contact forces can align with chain orders, such as pitch frequency, causing additional excitations and unacceptable performance. NVH of the chain system is often caused by pitch orders, which is the noise associated with engagement of each link of the chain with sprockets and tensioners as well as the engagement differences which occur at half pitch and twice pitch orders due to the engagement differences from the links in guide row to the links in the non-guide row or flanks transitions along the teeth of the chain links of the chain. Orders are related to the number of events per revolution. Frequency is the number of events per unit of time. So, a chain order equals one chain revolution. Pitch order equals the number of teeth on the drive sprocket. So, if the drive sprocket has 40 teeth, then one sprocket revolution equals the 40th order and is called the pitch order. Frequency (Hz) can then be expressed as (order #×rpm)/60.

FIG. 2 shows a chain system 1. The chain system 1 has a driven sprocket 6 connected to a drive sprocket 2 via a toothed chain 8. The toothed chain 8 has a plurality of chain links 5 which are coupled together via coupling elements 7. Each of the chain links 5 have a body with a back 9 which can contact a tensioning device 12. Opposite the back 9 of the chain link 5 is a pair of teeth 5. Within the body of the link 5 is a pair of apertures 11 for receiving coupling elements 7. The teeth 3 of the links 5 engage with the teeth driven sprocket 6 and the drive sprocket 2. A first tensioner 10 is present adjacent to the first strand 8a of the chain 8 to maintain tension on the first strand 8a and a second tensioner 12 is adjacent to the second strand 8b of the chain 8 to maintain tension on the second strand 8b. The tension is maintained through biased contact of the first and second tensioners 10, 12 on the backs 9 of the links 5 at certain areas of the chain strands 8a, 8b, biasing the chain strands 8a, 8b towards each other. The first strand 8a is the tight strand and the second strand 8b is the slack strand of the chain 8.

SUMMARY

According to one embodiment of the present invention, a method of altering tensioner face compliance to decrease NVH is disclosed. In one embodiment, the method comprises: receiving chain system characteristics of at least: a layout of the chain system, chain system conditions, an initial tensioner face geometry of the at least first tensioner and an applied force of the tensioner face on the chain; determining a contact length of the tensioner face with the chain to be less than two pitch lengths of the chain; defining a compliance tensioner face geometry requirement of contact length and tensioner face geometry to obtain a compressed state of the tensioner face with a set amount of compliance; determining an applied force tensioner face stiffness requirement to obtain the compressed state based on the compliance geometry requirement; optimizing the compliance geometry requirement and applied force tensioner face stiffness requirement for the tensioner face geometry; and applying the optimized compliance geometry requirement and applied force tensioner face stiffness requirement to the tensioner face geometry to produce a tensioner arm.

Examples of tensioning devices including a complaint face that meets compliance geometry requirements and applied force tensioner face stiffness requirements to the tensioner face geometry can include a tensioning device with a compliant face with an incorporated blade spring, a tensioning device with an incorporated tensioner spring into the complaint face, a compliant face located at the edge of the tensioning device, a spring utilized as a tensioner device with an elastomer face, a tensioning device with a complaint face, and a tensioning device with an elastomer pocket.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 14 shows the legend associated with tensioner torque fluctuation (Nm) for FIGS. 5a-5f and FIGS. 6a-6d.

DETAILED DESCRIPTION

Compliance can be applied to the tensioner's face to either alter the chain contact area or minimize the chain contact force, therefore preventing alignment with chain orders of concern. Embodiments of the present invention utilize a compliant face on the chain's motion control device (such as a tensioner face, arm, guide, or snubber) so that the contact area increases with strand tension. The compliance and the geometry of the contact face is determined by a method disclosed herein. For example, moving from a single link contact area to a multiple link contact area can reduce the pitch frequency content. This compliance can be obtained with intentional geometries, such as thin material sections, designed to target specific contact stiffness requirements. The application's desired contact stiffness may also require the addition of a blade spring or other spring type to be incorporated into the tensioner's design.

Figure 1:
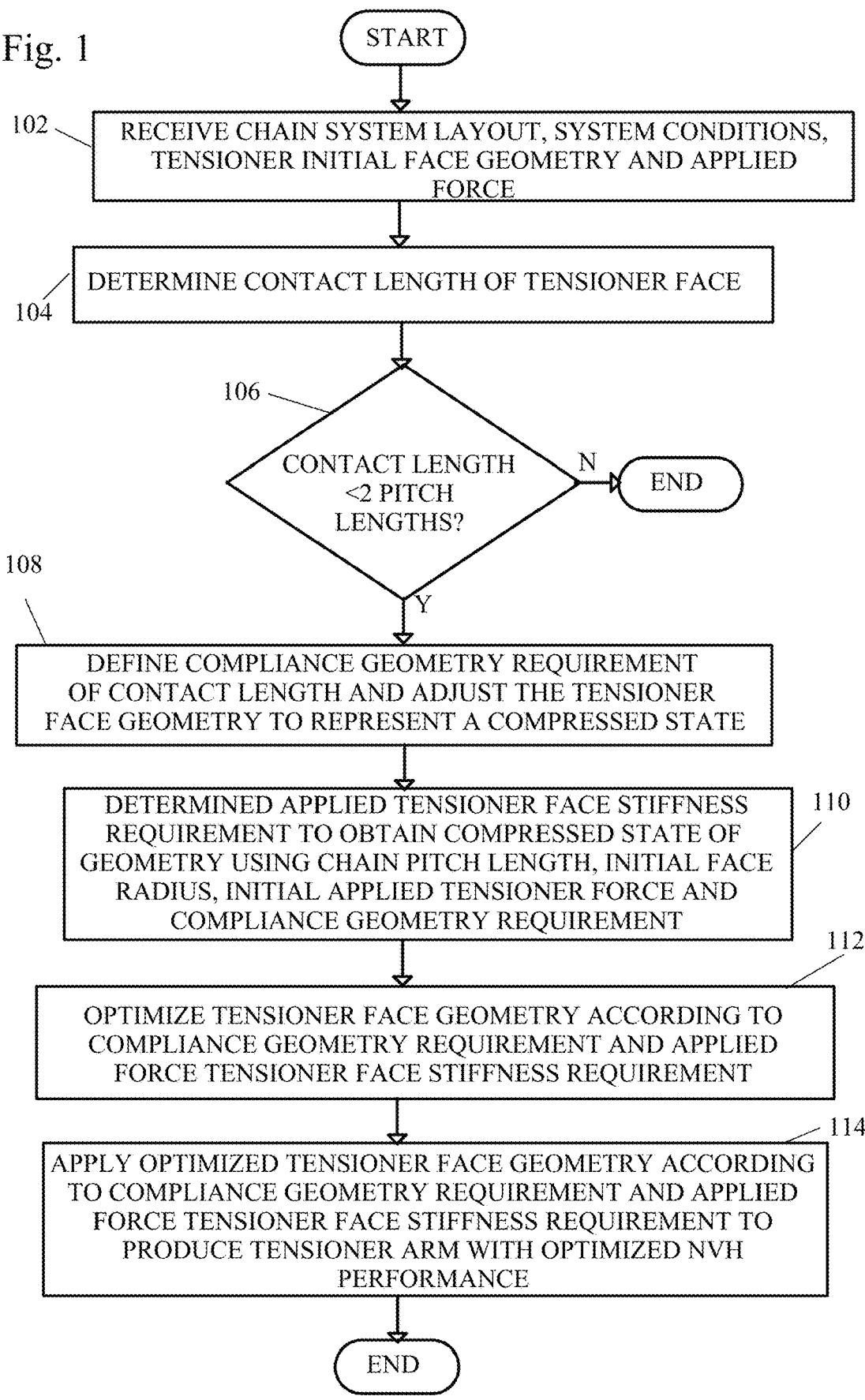
FIG. 1 shows a flow diagram of a method of altering tensioner face compliance to decrease NVH.
Figure 2:
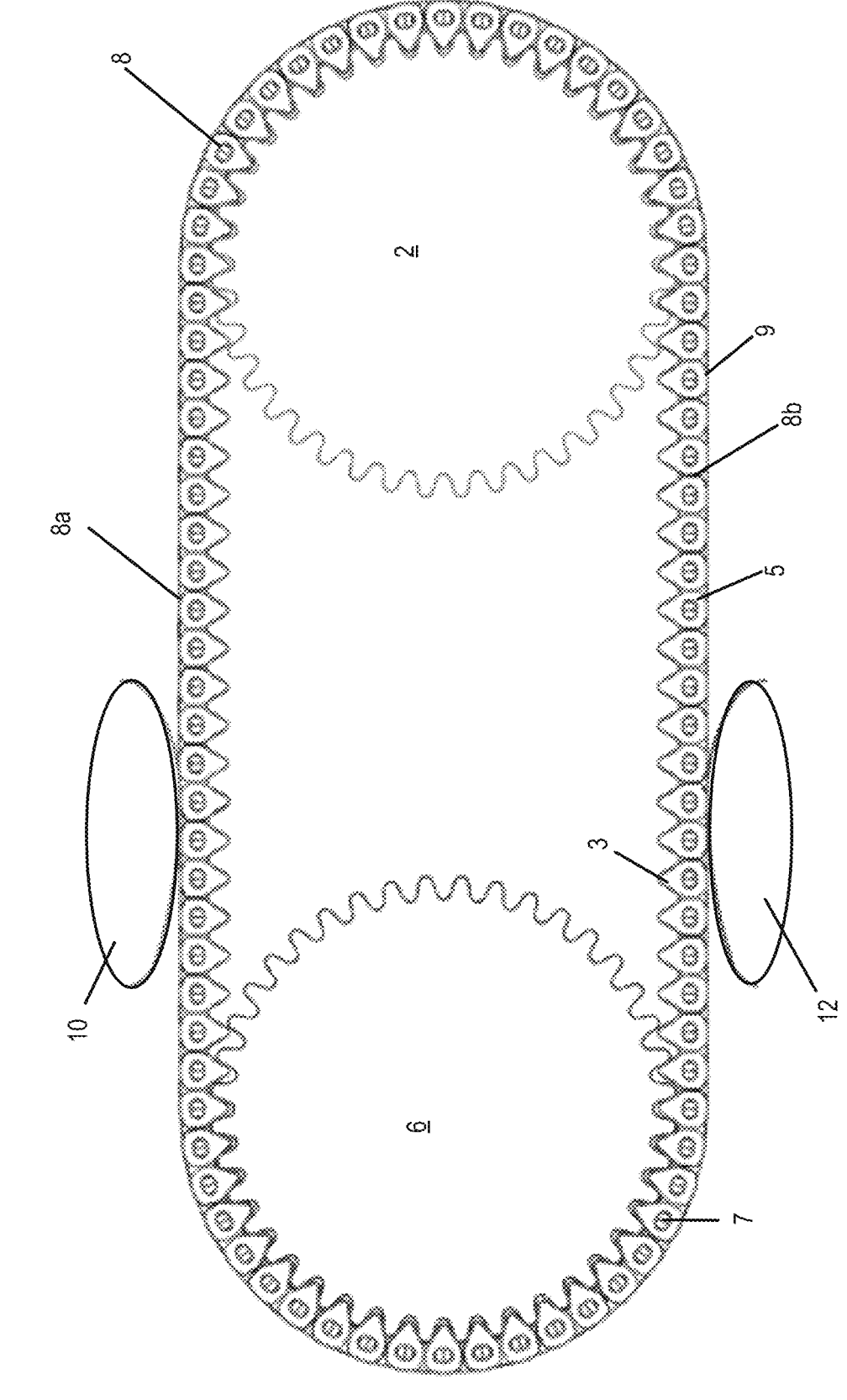
FIG. 2 shows an example of a chain system.

FIG. 1 shows a flow diagram of a method of altering tensioner face compliance to decrease NVH.

In a first step, a computer receives a chain system layout, system conditions, initial face geometry and applied force on the tensioner face of the tensioning device (step 102). The chain system layout can include, and is not limited to: chain type, sprocket tooth profile, chain pitch, and center distances between chain links. System conditions can include, but is not limited to: drive cycle and state of the chain, for example new or worn chain, chain order, frequency and pitch order. The initial tensioner face geometry includes, but is not limited to, at least the radii of curvature of the face and stiffness of the tensioner face.

Based on the chain system layout, system conditions, initial tensioner face geometry and applied force on the tensioner face of the tensioning device, the computer determines the contact length of the tensioning face of the tensioning device with the chain strand (step 104). The contact length is defined as the actual length of the tensioner face of the tensioning device that contacts the strand of the chain and applies tension directly to the chain when the chain is being driven by the driven sprocket.

Figure 3:
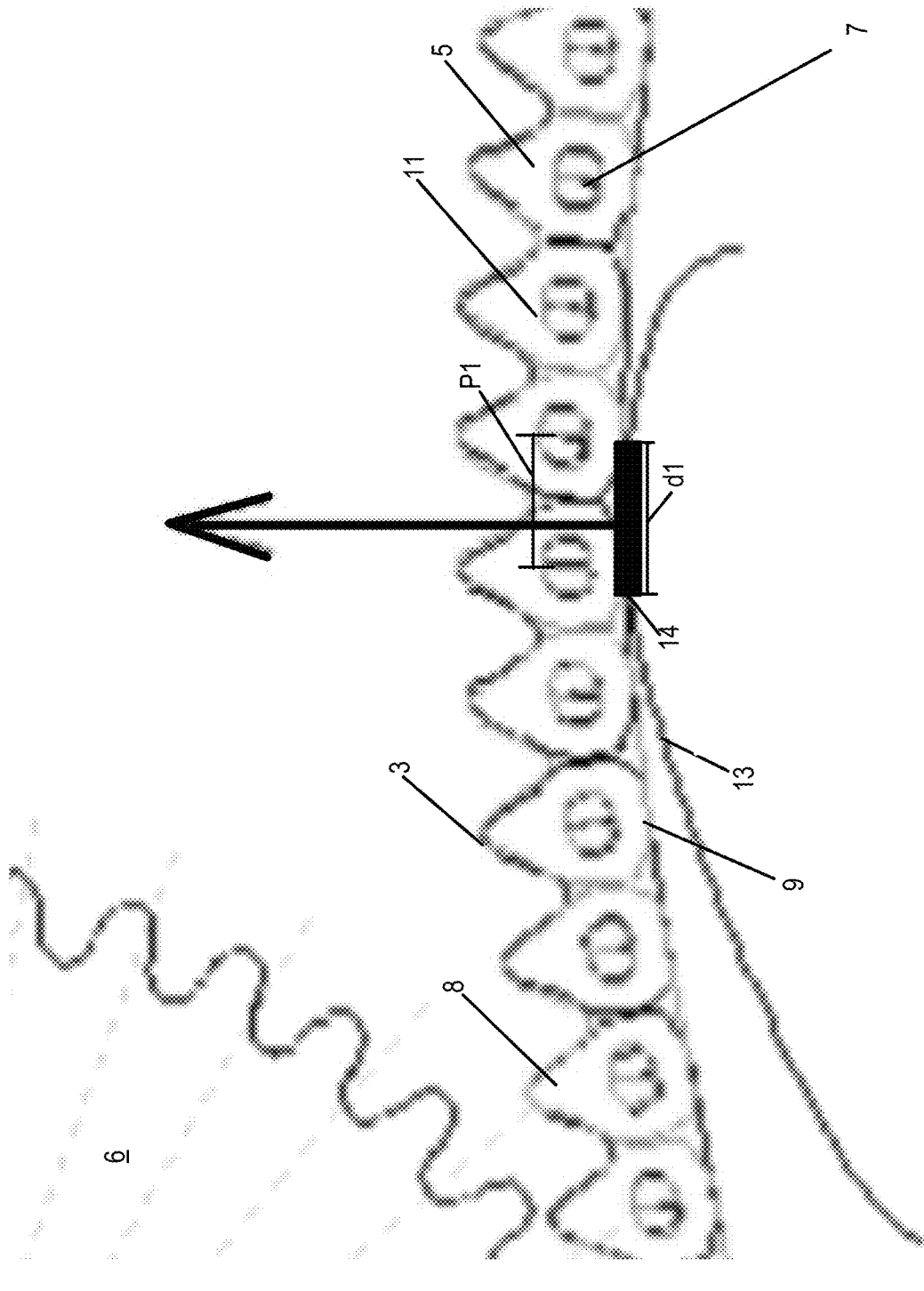
FIG. 3 shows an example of a contact area of less than two pitch lengths.

For example, FIG. 3 shows a section of a strand of a chain 8 of a chain system 1 in contact with a tensioner 12. Based on the chain system layout, such as chain type, sprocket tooth profile, and system conditions, the contact length between the chain and tensioner face is determined. In this case the contact area 14 between the tensioner face 13 and the backs 9 of the chain links 5 has a distance d1 of approximately a single pitch length (P1). The contact area 14 of the tensioner is compressed or in a compressed state when the tensioner face 13 contacts the backs 9 of the links 8 of the chain. Deformation of the tensioner face at this stage in the design is assumed to be small as it is assumed a solid shape with little compliance.

If the contact length of the compliant tensioner face of the tensioner is greater than two pitch lengths (step 106), the method ends.

If the contact length of the compliant tensioner face is less than two pitch lengths (step 106), the computer defines the compliance tensioner face geometry requirement of contact length and tensioning face geometry to represent a compressed state with a set amount of compliance (step 108). Step 108 may be repeated as necessary using different assumed compressed state tensioner faces until the desired performance is achieved. The compressed state is a state in which the tensioner face of the tensioning device is applying a force on the chain such that the tensioner face deforms.

Figure 4:
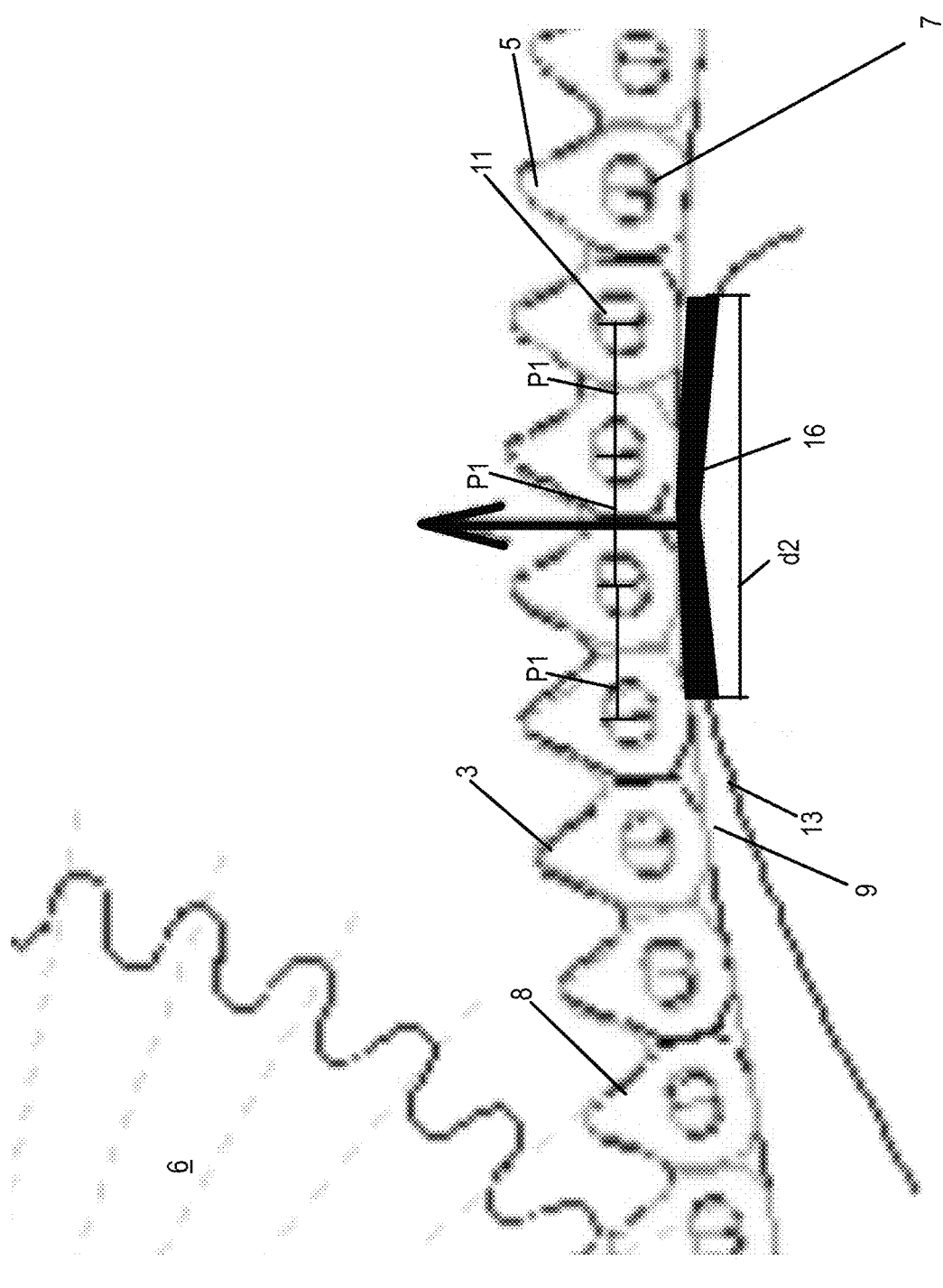
FIG. 4 shows an example of a contact area of greater than two pitch lengths.

FIG. 4 shows a section of a strand of a chain of a chain system in contact with a tensioner. In this example, a contact area 16 of two or more pitch lengths (P1) is present between the backs 9 of the links 8 and the tensioner face 13 of the tensioner 12. The contact area 16 of the tensioner is compressed or in a compressed state when the tensioner face 13 contacts the backs 9 of the links 8 of the chain. The contact area 14 has a length 14 equivalent to a distance d2, which spans at least two pitch lengths P2.

Figure 14:
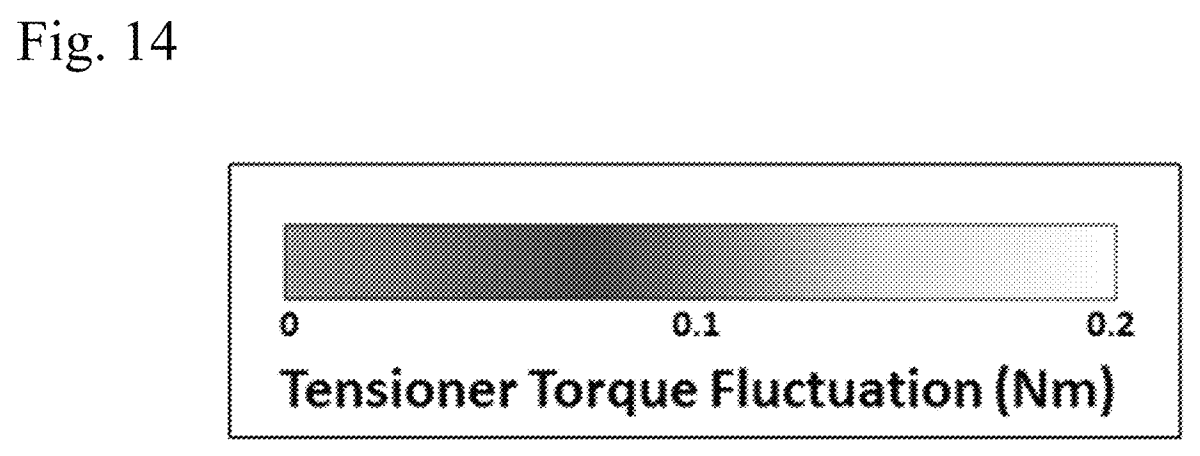

FIG. 5a-5f shows tensioner torque fluctuations at different assumed contact stiffness on the slack strand 8b of the chain 8 and the tight strand 8a of the chain 8. FIG. 14 shows the legend associated with tensioner torque fluctuation (Nm) for FIGS. 5a-5f and FIGS. 6a-6d discussed below.

Figure 5A:
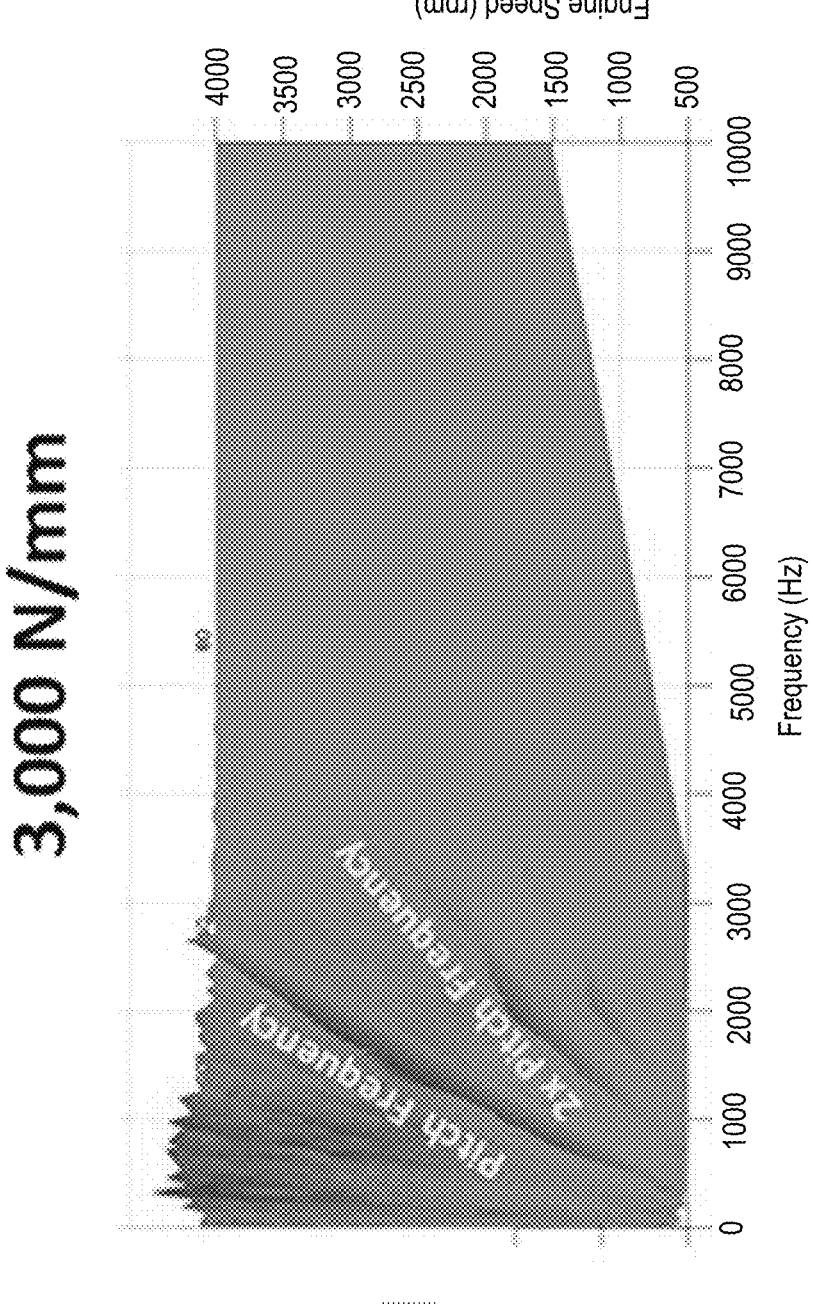
FIG. 5a shows the tensioner face contact stiffness at a tensioner face stiffness of 3000 N/mm of a tensioner mounted adjacent to the tight strand of the chain at different pitch frequencies at various engine speeds and resulting tensioner torque fluctuations.
Figure 5B:
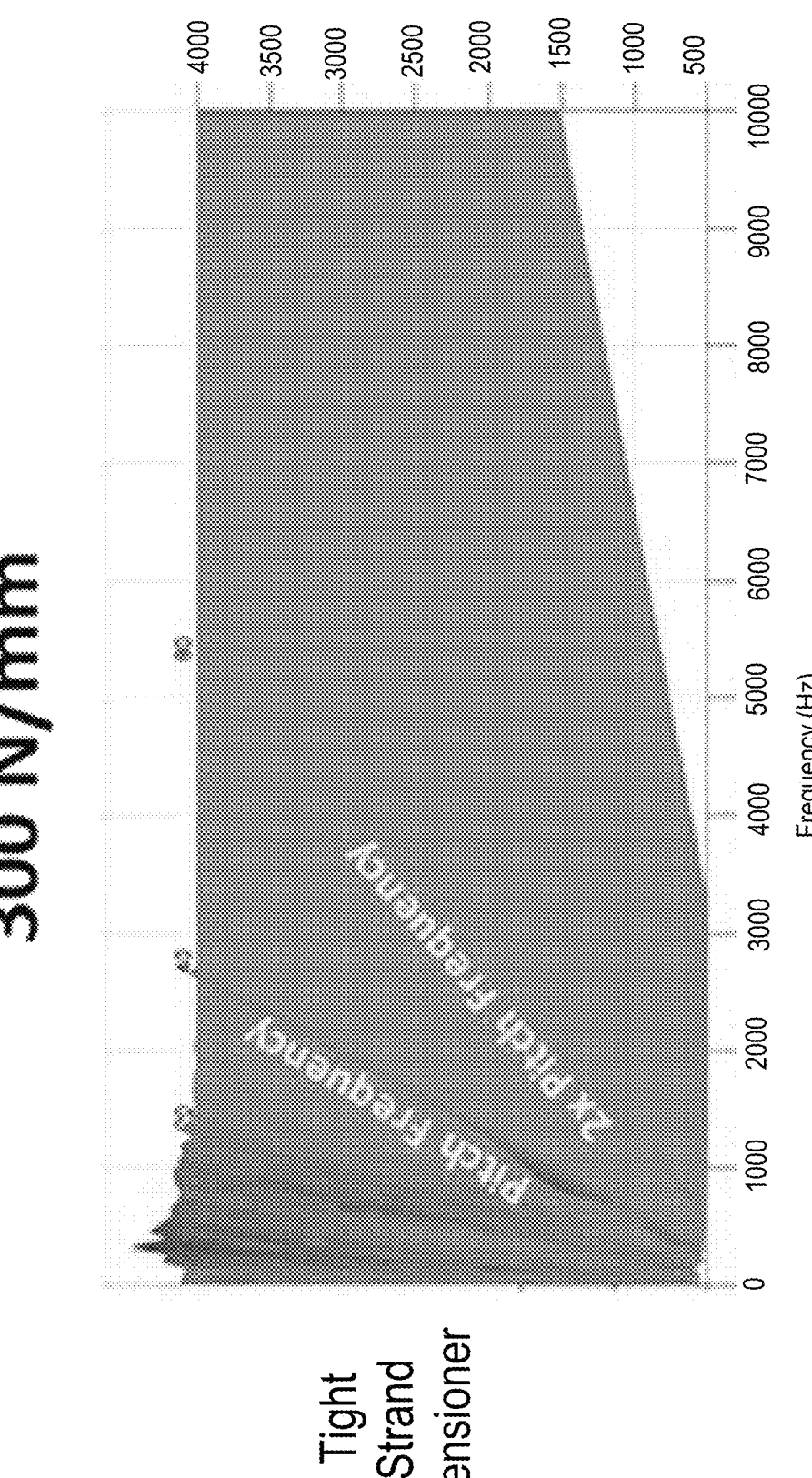
FIG. 5b shows the tensioner face contact stiffness at a tensioner face stiffness of 300 N/mm of a tensioner mounted adjacent to the tight strand of the chain at different pitch frequencies at various engine speeds and resulting tensioner torque fluctuations.
Figure 5C:
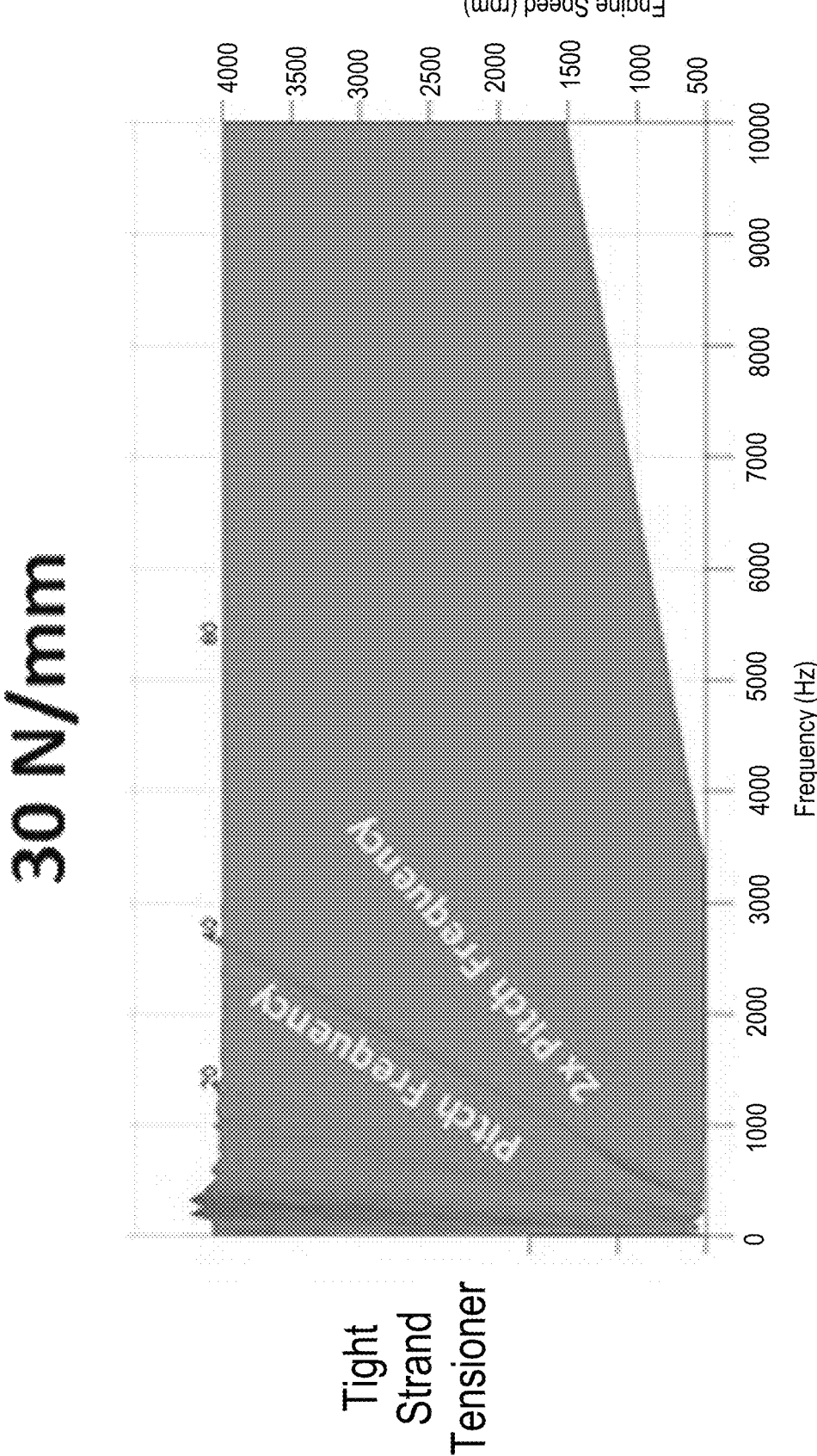
FIG. 5c shows the tensioner face contact stiffness at a tensioner face stiffness of 30 N/mm of a tensioner mounted adjacent to the tight strand of the chain at different pitch frequencies at various engine speeds and resulting tensioner torque fluctuations.

FIGS. 5a, 5b and 5c show the tensioner torque fluctuations at different assumed contact stiffness of a tensioner mounted adjacent to the tight strand of the chain at different pitch frequencies at various engine speeds and resulting tensioner torque fluctuations.

Referring to FIG. 5a, the pitch frequency in this example has a frequency of approximately 500-2500 Hz at engine speeds of 700-4000 rpm with a tensioner torque fluctuation of less than 0.1 Nm at the applied tensioner face stiffness of 3000 N/mm on the tight strand of the chain. At two times the pitch frequency, the frequency is 1000-2000 Hz at engine speeds of 1000-2000 rpm with a tensioner torque of less than 0.1 Nm at the applied tensioner face stiffness of 3000 N/mm on the tight strand of the chain.

Referring to FIG. 5b, the pitch frequency is at a frequency of 2000 Hz or less, with the frequency concentrated around an engine speed of 700-2000 rpm with a tensioner torque fluctuation of less than 0.1 Nm at the applied tensioner face stiffness of 300 N/mm on the tight strand of the chain. At two times the pitch frequency, very little tensioner torque fluctuation is seen for the tight strand of the chain between 500-4000 rpm.

Referring to FIG. 5c, the pitch frequency is less than 1000 Hz, with the frequency concentrated around an engine speed of 700-1500 rpm with a tensioner torque fluctuation of less than 0.1 Nm at the applied tensioner face stiffness of 30 N/mm on the tight strand of the chain. At two times the pitch frequency, very little tensioner torque fluctuations is seen for the tight strand of the chain between 500-4000 rpm.

Figure 5D:
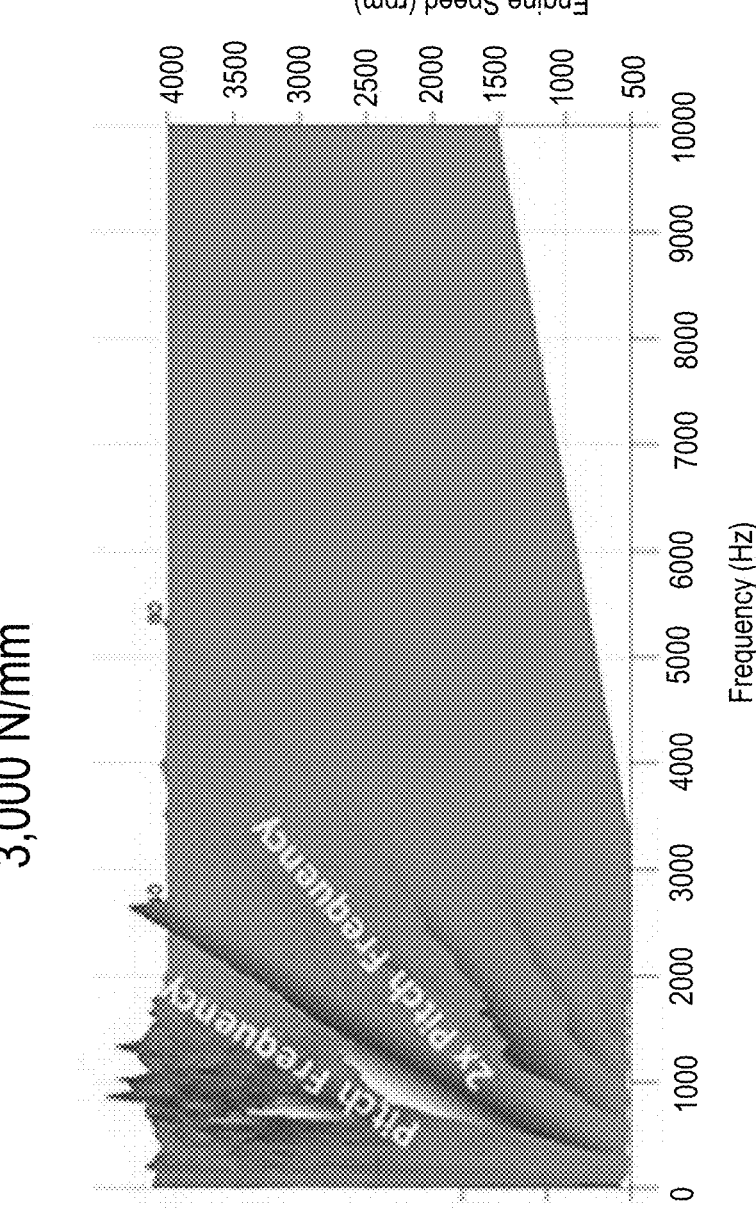
FIG. 5d shows the tensioner face contact stiffness at a tensioner face stiffness of 3000 N/mm of a tensioner mounted adjacent to the slack strand of the chain at different pitch frequencies at various engine speeds and resulting tensioner torque fluctuations.
Figure 5E:
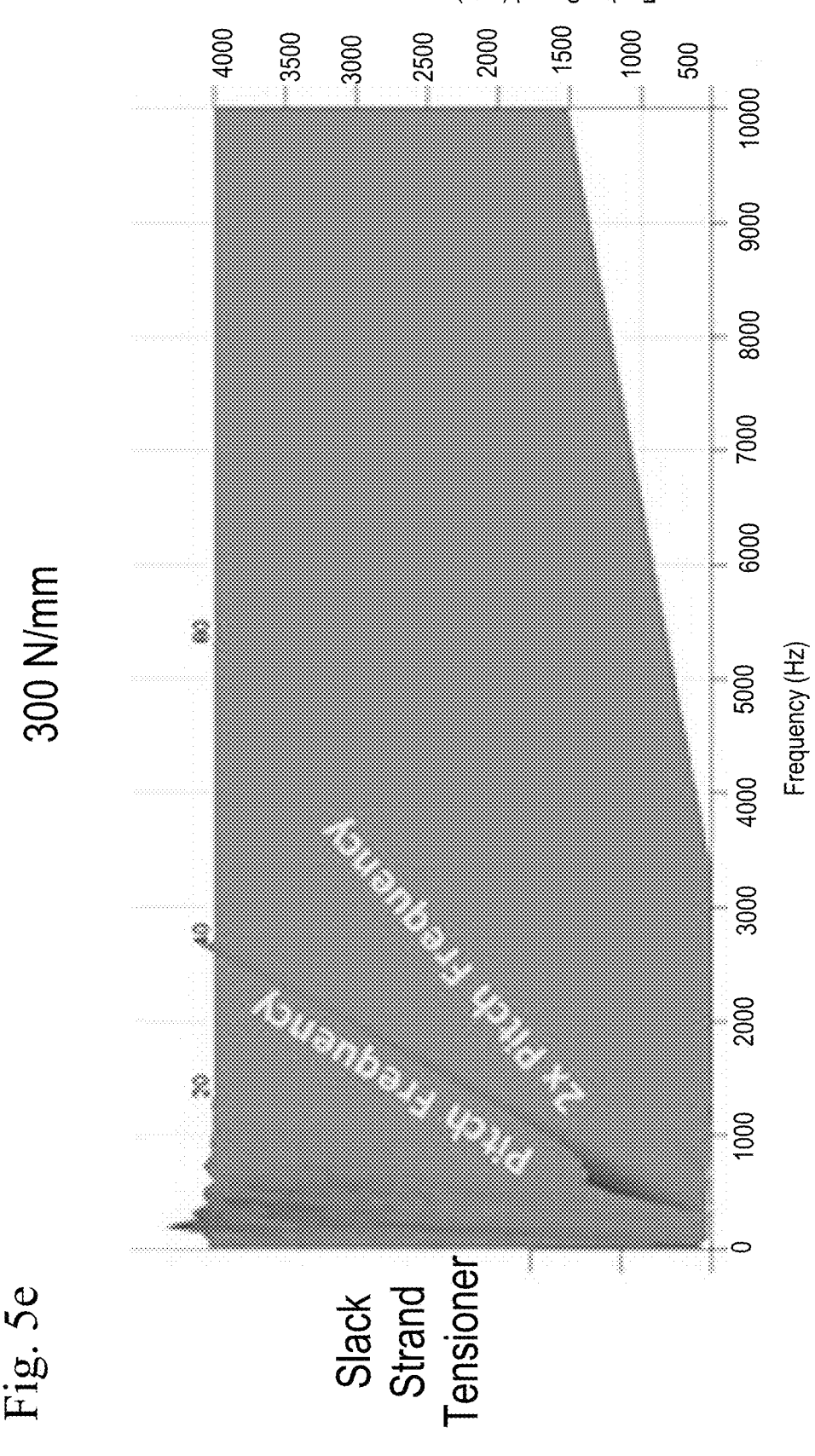
FIG. 5e shows the tensioner face contact stiffness at a tensioner face stiffness of 300 N/mm of a tensioner mounted adjacent to the slack strand of the chain at different pitch frequencies at various engine speeds and resulting tensioner torque fluctuations.
Figure 5F:
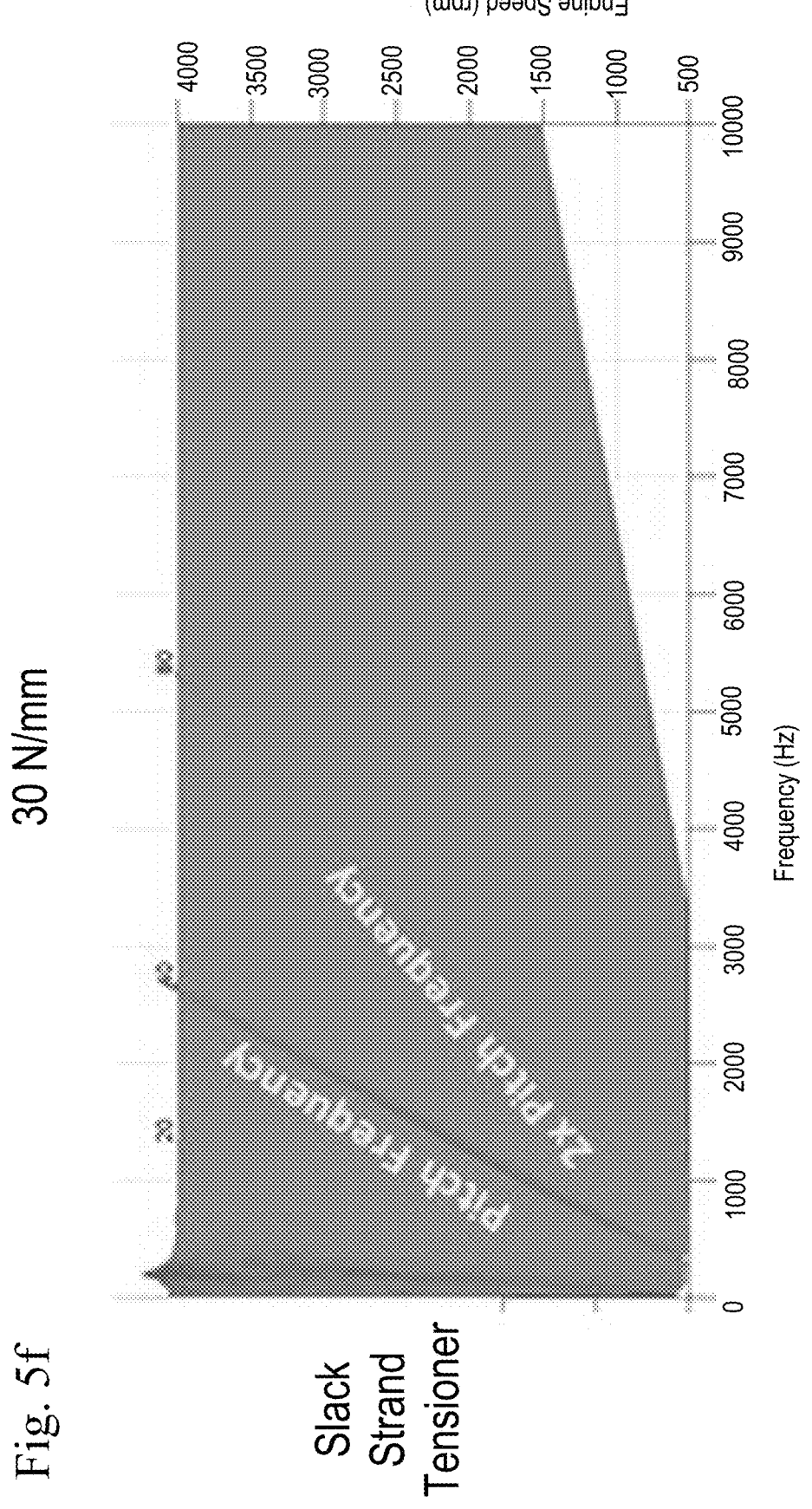
FIG. 5f shows the tensioner face contact stiffness at a tensioner face stiffness of 30 N/mm of a tensioner mounted adjacent to the slack strand of the chain at different pitch frequencies at various engine speeds and resulting tensioner torque fluctuations.

FIGS. 5d, 5e and 5f show the tensioner face contact stiffness of a tensioner mounted adjacent to the slack strand of the chain at different pitch frequencies at various engine speeds and resulting tensioner torque fluctuations.

Referring to FIG. 5d, the pitch frequency is between 200-2500 Hz, with the frequency concentrated between an engine speed of 500-4000 rpm with a tensioner torque fluctuation of approximately between 0.08 to 0.18 Nm. At two times the pitch frequency, the frequency is concentrated around 800-2500 Hz at an engine speed of 500-2200 rpm with a tensioner fluctuation torque of approximately less than 0.1 Nm.

Referring to FIG. 5e, the pitch frequency is less than 2000 Hz, with concentrations at a frequency of less than 500 Hz at engine speeds of less than 1600 rpm. The concentration has tensioner torque fluctuations of less than 0.1 Nm. At two times the pitch frequency, very little tensioner torque fluctuation is seen for the slack strand of the chain between 500-4000 rpm.

Referring to FIG. 5f, at pitch and two times the pitch frequency, very little tensioner-torque fluctuation is seen for the slack strand of the chain between 500-4000 rpm. Pitch frequency remains below 0.05 Nm across 500-4000 rpm.

The simulations shown in FIGS. 5a-5f provide the compliance tensioner face geometry requirement of contact length and tensioner face geometry to obtain a compressed state with a contact length of greater than two pitch lengths at various engine speeds with a set amount of compliance or tensioner face contact stiffness. In particular, with the applied load that was used, and the initial geometry and other information, the 30 N/mm stiffness is approximately a two pitch contact. The figures show the reduction of tensioner applied torque frequency content and hence, better NVH performance.

Referring back to FIG. 1, the applied tensioner face stiffness requirement to obtain the compressed state is determined, using chain pitch length, initial face radius geometry, applied tensioner force at the tensioners extended state during operation and the compliance geometry requirement (step 110).

Figures 13A, 13D:
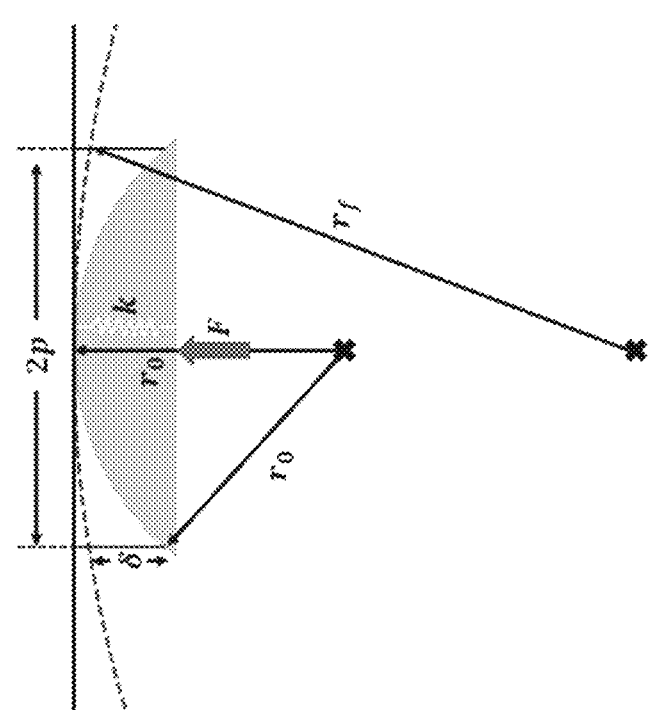
FIG. 13a shows an example of a chain face and associated variables being measured.
FIG. 13d shows a diagram of the chain face with associated variables.
Figure 13B:
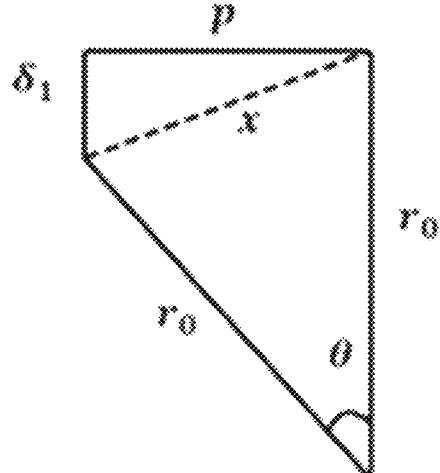
FIG. 13b shows a diagram for determining the collapsed distance to create two pitch length contact with a flat surface.
Figure 13C:
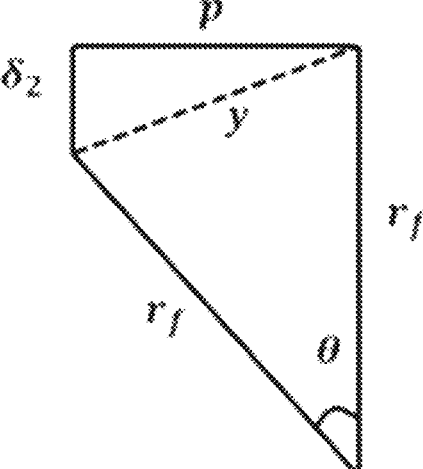
FIG. 13c shows a diagram for determining the distance between the desired radius of conformance and the flat surface.
Figure 13E:
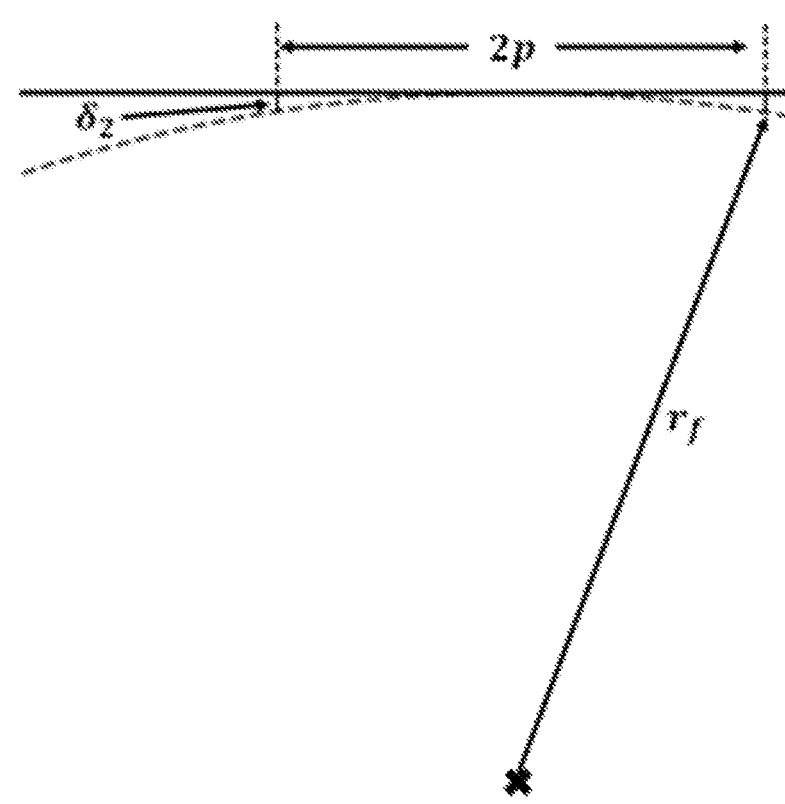
FIG. 13e shows a diagram of relationships between the desired radius of conformance, pitch length and distance between a flat surface and the desired radius of conformance.

The variables shown in FIGS. 13a-13e are defined as follows:
p=chain pitch length
2p=2 times pitch length
$r_0$=initial face radius $r_f$=desired face radius
k=required face stiffness
F=applied tensioner force
$\delta_1$=collapsed distance to create 2 pitch contact length with radius
$\delta_2$=distance between $R_f$ and flat surface
$\delta$=collapsed distance to create 2 pitch contact with radius
$\theta$=angle between $r_0$ and $r_0$ in FIG. 13b or between $r_f$ and $r_f$ in FIG. 13c
x=hypothenuse of triangle
y=hypothenuse of triangle FIGS. 13a, 13d and 13e show an example of the geometry of the tensioner face and associated variables. Equation 1.1 is used to determine the collapsed distance to create 2 pitch contacts with a radius of the tensioner face based on the variables shown.

$$\delta = \delta_1 - \delta_2 \tag{1.1}$$

Where:
$\delta$=collapsed distance to create 2 pitch contact with radius
$\delta_1$=collapsed distance to create 2 pitch contact with flat surface
$\delta_2$=distance between $r_f$ and flat surface The collapsed distance to create 2 pitch contact with a flat surface ($\delta_1$) is determined using FIG. 13b and equations (2.1)-(2.5) and the distance ($\delta_2$) between the desired radius of conformance ($r_f$) and the flat surface is determined using FIG. 13c and equation (2.6).

As shown in FIG. 13b, the chain pitch length (p) and the initial face radius ($r_0$) are used.

$$x^2 = \delta_1^2 + p^2 \tag{2.1}$$

Where:
x=hypothenuse of triangle
$\delta_1$=collapsed distance to create 2 pitch contact with flat surface
p=pitch length $$\theta = \sin^{-1}\left(\frac{p}{r_0}\right) \tag{2.2}$$

Where:
p=pitch length
$r_0$=initial face radius
$\theta$=angle between $r_0$ and $r_0$ $$x = \sqrt{2r_0^2 - 2r_0^2\cos(\theta)} \tag{2.3}$$

Where:
p=pitch length
$r_0$=initial face radius
x=hypothenuse of triangle

Substituting equation (2.2) into equation (2.3) results in equation (2.4) of:

$$x = \sqrt{2r_0^2 - 2r_0^2\cos\left(\sin^{-1}\left(\frac{p}{r^0}\right)\right)} \tag{2.4}$$

Where:

p=pitch length $r_0$=initial face radius x=hypotenuse of triangle

Substituting equation (2.4) into equation (2.1) results in equation (2.5) of:

$$\delta_1 = \sqrt{2r_0^2 - 2r_0^2 \cos\left(\sin^{-1}\left(\frac{p}{r_0}\right)\right) - p^2} \qquad (2.5)$$

Where:

p=pitch length $r_0$=initial face radius $\delta_1$=collapsed distance to create 2 pitch contact with flat surface The distance ($\delta_2$) between the desired radius of conformance ($r_f$) and the flat surface is shown below:

$$\delta_2 = \sqrt{2r_f^2 - 2r_f^2 \cos\left(\sin^{-1}\left(\frac{p}{r_f}\right)\right) - p^2} \qquad (2.6)$$

Where:

$r_f$=desired face radius p=pitch length $\delta_2$=distance between $r_f$ and flat surface Substituting equation (2.5) and (2.6) into equation (1.1) results in equation (2.7):

$$\delta = \sqrt{2r_0^2 - 2r_0^2 \cos\left(\sin^{-1}\left(\frac{p}{r_0}\right)\right) - p^2} - \sqrt{2r_f^2 \cos\left(\sin^{-1}\left(\frac{p}{r_f}\right)\right) - p} \qquad (2.7)$$

Where:

p=pitch length $r_0$=initial face radius $r_f$=desired face radius $\delta$=collapsed distance to create 2 pitch contact length with radius The required face stiffness (k) is calculated using equation (1.2) of:

$$k \leq \frac{F}{\delta} \qquad (1.2)$$

Where:

F is the applied tensioner force $\delta$ is the collapsed distance to create 2 pitch contact with radius Substituting equation (2.7) into equation (1.2) results in equation (2.8) of:

$$k \leq \frac{F}{\sqrt{2r_0^2 - 2r_0^2 \cos\left(\sin^{-1}\left(\frac{p}{r_0}\right)\right) - p^2} - \sqrt{2r_f^2 - 2r_f^2 \cos\left(\sin^{-1}\left(\frac{p}{r_f}\right)\right) - p^2}} \qquad (2.8)$$

Where:

k=required face stiffness

F=applied tensioner force p=pitch length $r_0$=initial face radius $r_f$=desired face radius The compliance geometry requirement and the applied force tensioner face stiffness requirement for the tensioner force for the tensioner face geometry is then optimized (step 112), for example through computer simulation.

Based on the applied force tensioner face stiffness requirement determined in step 110, the computer simulates the frequency versus engine speed of a rigid face tensioner and a flexible face tensioner for a tensioner on the tight strand and the slack strand of the chain, as shown in FIGS. 6a-6d.

Figure 6A:
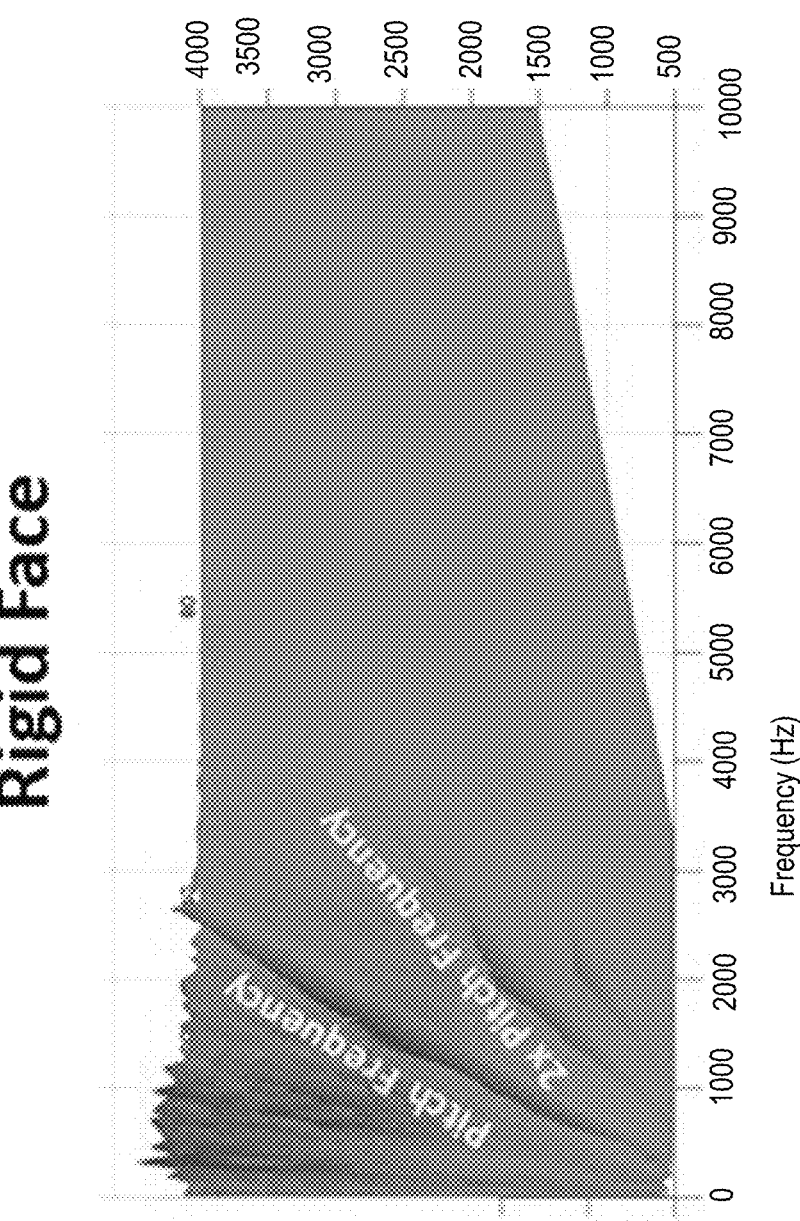
FIG. 6a shows an example of frequency versus engine speed of a rigid tensioner face mounted adjacent to the tight strand of the chain.

FIG. 6a shows the pitch frequency associated with the tight strand tensioner which has a rigid face at various engine speeds and at different applied tensioner torques. The pitch frequency has a frequency of approximately 500-2500 Hz at engine speeds of 700-4000 rpm with a tensioner torque fluctuation of less than 0.1 Nm. At two times the pitch frequency, the frequency is 1000-2000 Hz at engine speeds of 1000-2000 rpm with a tensioner torque of less than 0.1 Nm.

Figure 6B:
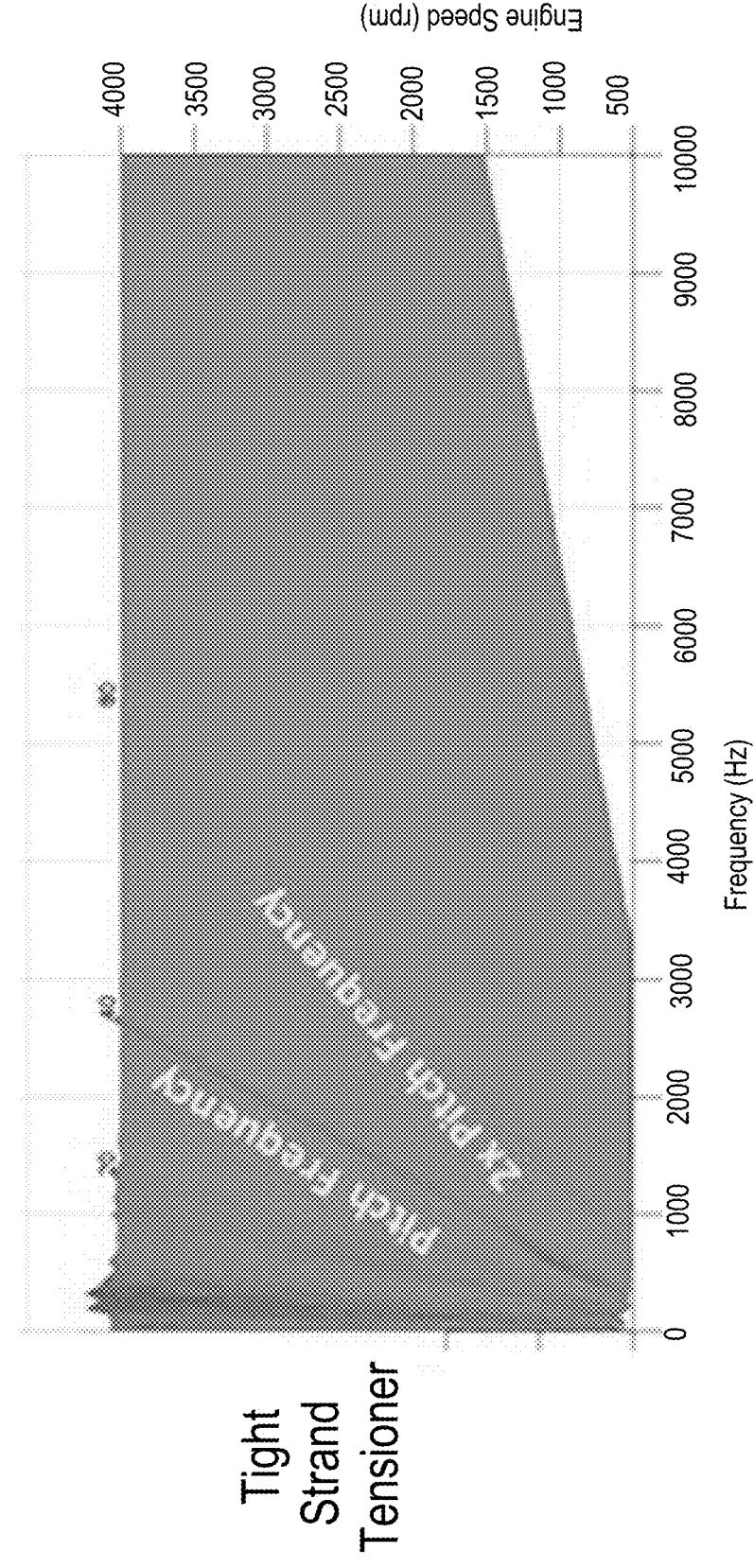
FIG. 6b shows an example of frequency versus engine speed of a flexible tensioner face mounted adjacent to the tight strand of the chain.

FIG. 6b shows the pitch frequency associated with the tight strand tensioner which has a flexible face at various engine speeds and at different applied tensioner torques. The pitch frequency is less than 1000 Hz, with the frequency concentrated around an engine speed of 700-1500 rpm with a tensioner torque fluctuation of less than 0.1 Nm. At two times the pitch frequency, very little tensioner torque fluctuations are seen for the tight strand of the chain between 500-4000 rpm.

Figure 6C:
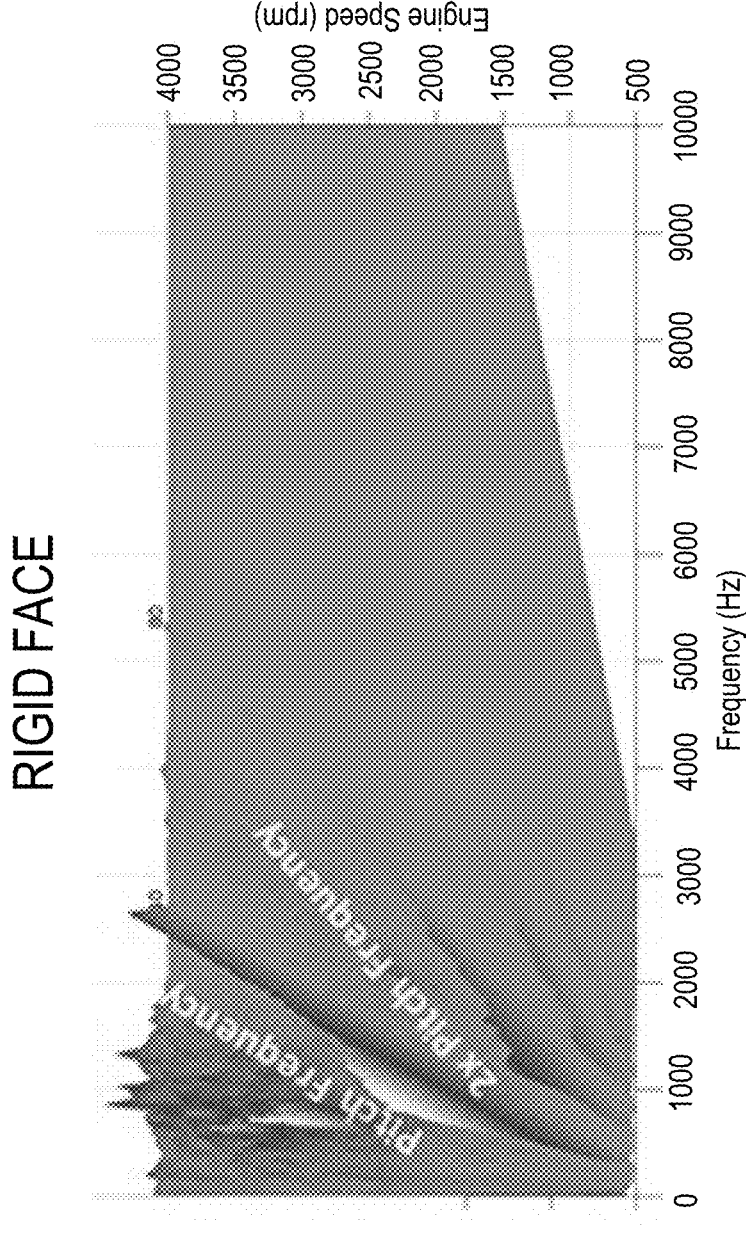
FIG. 6c shows an example of frequency versus engine speed of a rigid tensioner face mounted adjacent to the slack strand of the chain.

FIG. 6c shows the pitch frequency associated with the slack strand tensioner which has a rigid face at various engine speeds and at different applied tensioner torques. The pitch frequency is between 200-2500 Hz, with the frequency concentrated between an engine speed of 500-4000 rpm with a tensioner torque fluctuation of approximately between 0.08 to 0.18 Nm. At two times the pitch frequency, the frequency is concentrated around 800-2500 Hz at an engine speed of 500-2200 rpm with a tensioner fluctuation torque of approximately less than 0.1 Nm.

Figure 6D:
FIG. 6d shows an example of frequency versus engine speed of a flexible tensioner face mounted adjacent to the slack strand of the chain.

FIG. 6d shows the pitch frequency associated with the slack strand tensioner which has a flexible face at various engine speeds and at different applied tensioner torques. At pitch frequency and two times the pitch frequency, very little torque fluctuation is seen for the slack strand of the chain between 500-4000 rpm. Pitch frequency remains below 0.05 Nm across 500-4000 rpm.

Referring back to FIG. 1, the optimized compliance geometry from the compliance geometry requirement is applied, along with the applied force tensioner face stiffness requirement to produce at least one tensioner arm with optimized NVH performance (step 114) and the method ends.

FIGS. 7-11 shows example of tensioners with incorporated compliance to meet the compliance geometry requirement and the applied force tensioner face stiffness requirement.

Figure 7:
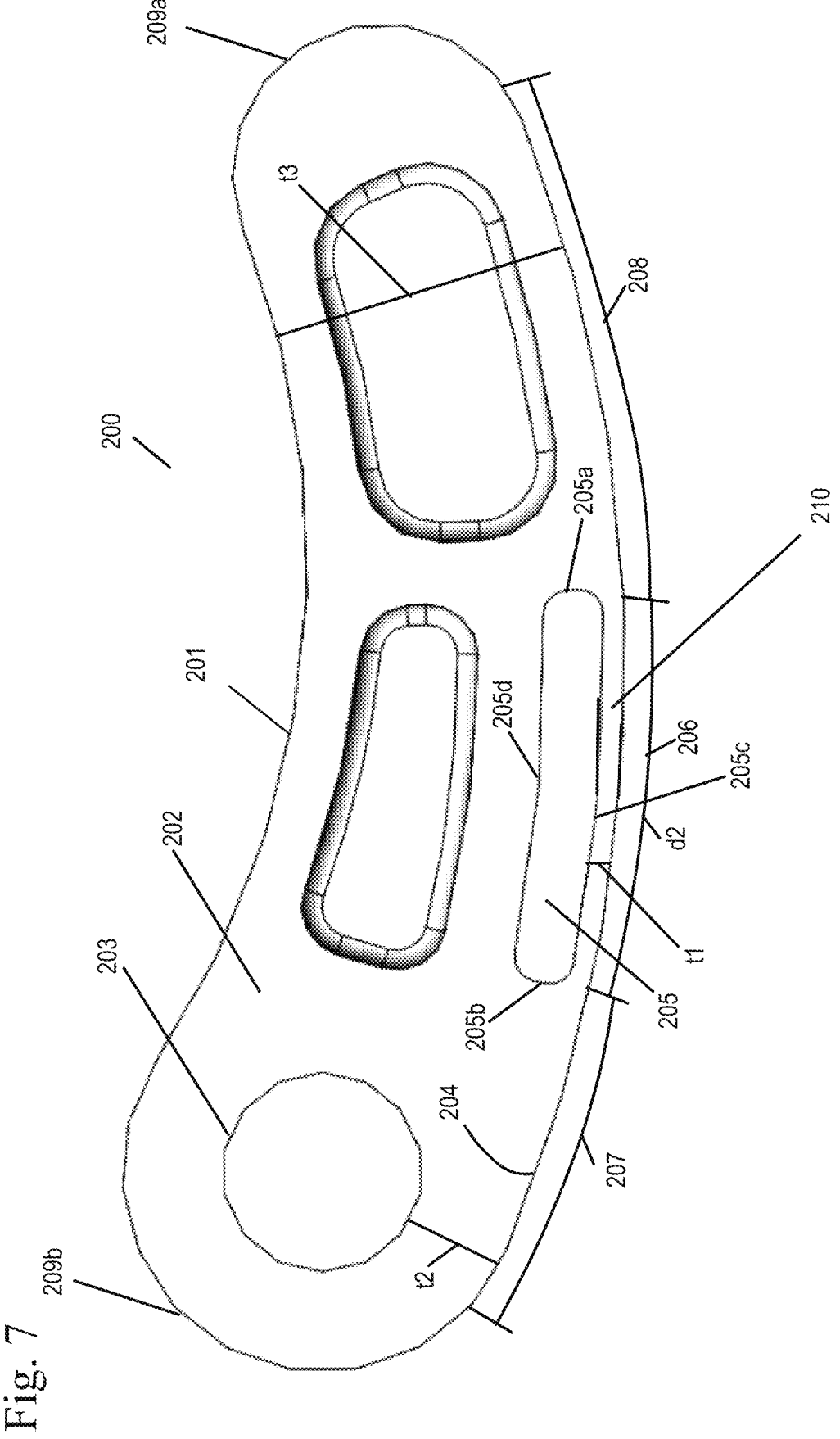
FIG. 7 shows a tensioning device with a complaint face.

FIG. 7 shows a tensioning device with a complaint face. The tensioning device or tensioner 200 has a body 202 defining a first end 209a, a second end 209b, a first lateral surface 201, a second lateral surface, opposite the first lateral surface 201 and acting as the tensioner face 204, and a pivot hole 203. The body 202 of the tensioner 200 rotates about the pivot hole 203. Between the first end 209a and the second end 209b is a tensioner face 204 in which at least a portion acts as a contact area 206 and contacts a strand of the chain 8. The tensioner face 204 has a radius of curvature extending from the first end 209a of the body 202 to the second end 209b of the body 202. The contact area 206 has a distance of d2, greater than or equal to two pitch lengths of a chain in which the tensioning device 200 will engage. In a preferred embodiment, the contact area 206 has compliance or a stiffness that is less than that of the rest of the tensioner face 204, for example tensioner face areas 207, 208 on either side of the contact area 206. The compliance is achieved by removing a portion of the body 202 to provide a cavity 205 in alignment with the contact area 206 defined by the body 202. The cavity 205 has a first lateral end 205a, a second lateral end 205b, a first side, 205c and a second side 205d. Between the cavity 205 and the contact area 206 of the tensioner face 204 is a wall 210 with a thickness t1. The thickness t1 is less than the thickness t2 and thickness t3. Thickness t1 is measured between the contact area 256 of the tensioner face 204 and the first lateral side 205c of the cavity 205. Thickness t2 is measured between the non-contact area tensioner face 256 and the first lateral surface 201 of the body 202 of the tensioning device 200. Thickness t3 is measured between the non-contact area tensioner face 207 and the pivot hole 203. The first lateral end 205a of the cavity 205 is coincidental to wall 210 aligned with the tensioner face contact area 206. The tensioner face 204 in the contact area 206 is therefore of a thickness t1 that is less than the thicknesses t2, t3 of the remaining tensioner face areas 207, 208. It is noted that the compliance geometry requirement and the applied force tensioner face stiffness requirement of the tensioner face is determined by steps of FIG. 1 described above, along with the radius of curvature of the tensioner face 204. It is also noted that the length of the contact area 206 can vary.

Figure 8:
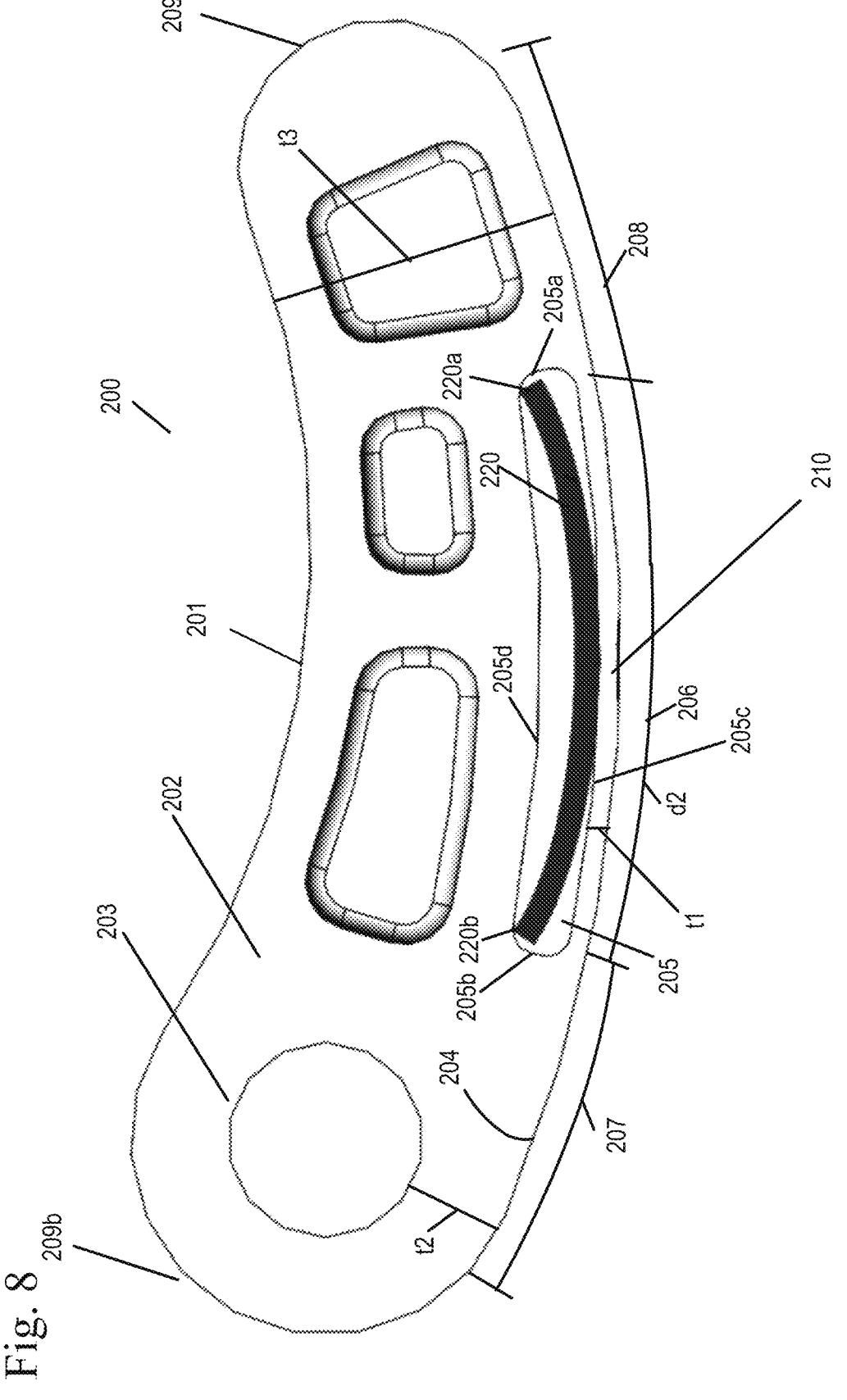
FIG. 8 shows an example of a tensioning device with a compliant face and an incorporated blade spring.

FIG. 8 shows an example of a tensioning device with a compliant face and an incorporated blade spring. In this embodiment, a blade spring 220 is present within the cavity 205 and aligned with the contact area 206 of the tensioner 200. A first end 220a of the blade spring 220 is adjacent to the first lateral end 205a of cavity 205 and a second end 220b of the blade spring is adjacent to the second lateral end 205b of the cavity 205. It is noted that the length of the cavity 205 and therefore the length d2 of the contact area 206 can vary embodiment to embodiment.

Figure 12:
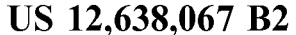
FIG. 12 shows an example of a tensioning device with an elastomer pocket.

FIG. 12 shows an alternate embodiment in which the cavity 205 is filled with an elastomer 221. The elastomer 221 preferably fills the entire cavity 205. The cavity 205 is aligned with the contact area 206 of the tensioner 200.

Figure 9:
FIG. 9 shows an example of a tensioning device incorporating a tensioner spring into the compliant face.

FIG. 9 shows an example of a tensioning device incorporating a tensioner spring into the compliant face. In this embodiment, a compliant tensioner spring 230 is present within the cavity 205 and extends from within the cavity 205 to around the pivot hole 203. More specifically, the compliant tensioner spring 230 has a first end 230a and a second end 230b with a length in between. The first end 230a is present within the cavity 205 adjacent the first lateral end 205a of the cavity 205 and extending through a second lateral end 205b of the cavity 205. The compliant tensioner spring 230 is parallel to the wall 210 between the cavity 205 and contact area 206 of the tensioner face 204 and remains approximately parallel to the remaining tensioner face area 207, after which the compliant tensioner spring 230 curves or bends 230c around the pivot hole 203 and extends radially away from the first lateral surface 201 of the body 202 of the tensioner 200 to the second end 230b.

Figure 10:
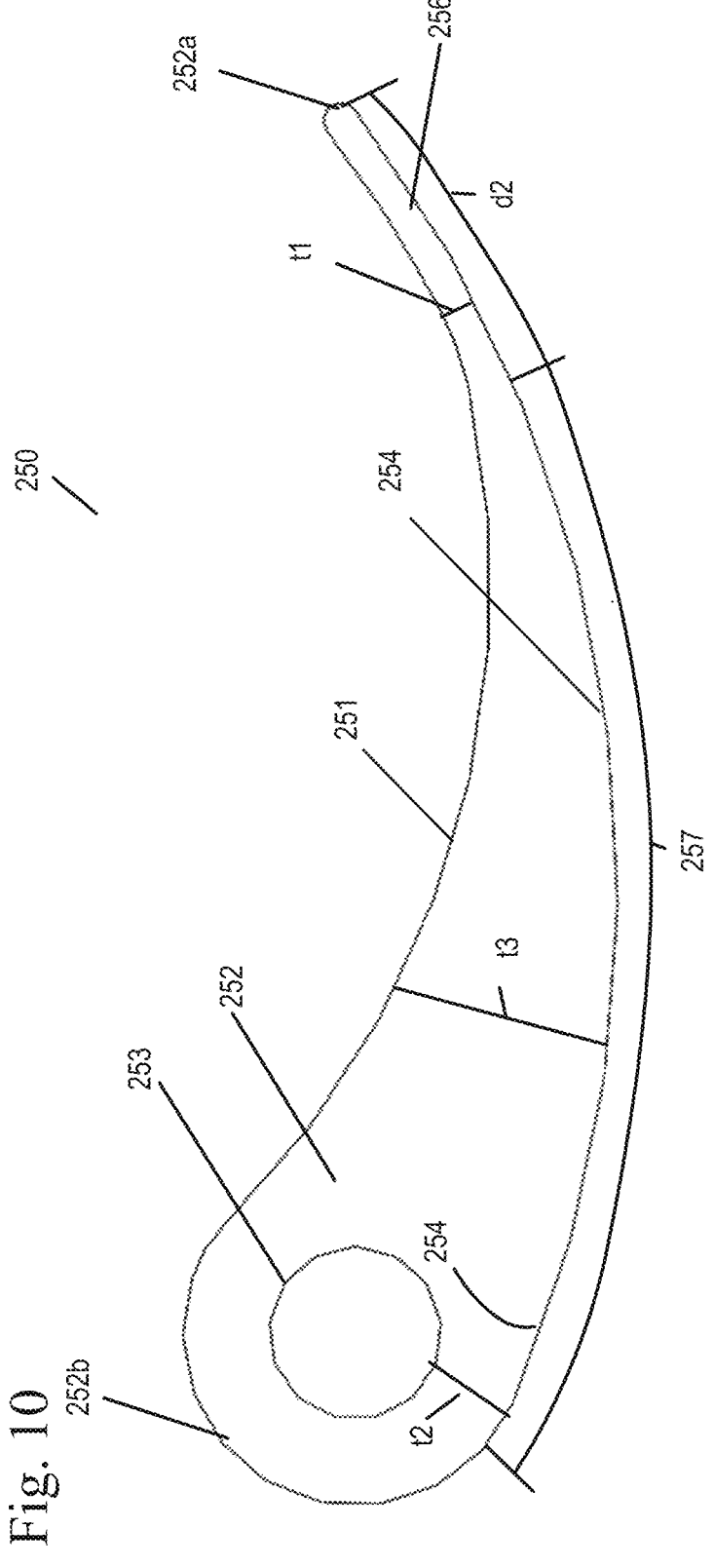
FIG. 10 shows an example of a tensioning device with a compliant face located at the edge of the device.

FIG. 10 shows an example of a tensioning device with a compliant face located at the edge of the device. In this embodiment, the tensioning device 250 has a body 252 defining a first end 252a, a second end 252b, a first lateral surface 251, a second lateral surface, opposite the first lateral surface 201 and acting as the tensioner face 254, and a pivot hole 253. The body 252 of the tensioner 250 rotates about the pivot hole 253. Between the first end 252a and the second end 252b is a tensioner face 254 in which at least a portion contacts a strand of the chain. The tensioner face 254 has a radius of curvature extending from the first end 252a of the body 252 to the second end 252b of the body 252. The portion that contacts the chain is a contact area 256 with a distance of d2, greater than or equal to two pitch lengths of a chain 8 in which the tensioning device 250 will engage. The contact area 256 in this embodiment is at the first end 252a of the body 252 and not in the middle of the body as in previous embodiments. In a preferred embodiment, the contact area 256 has compliance or a stiffness that is less than that of the rest of the tensioner face 254, for example tensioner face area 257 adjacent the contact area 256. The compliance is achieved by having the contact area 256 with a smaller thickness than the rest of the body 252. The contact area 256 of the body therefore has a thickness t4 that is less than the thickness t2, t3 of the remaining non-contact tensioner face area 257 in which little to no chain contact occurs. Thickness t4 is measured between the contact area 256 of the tensioner face 254 and the first lateral surface 251 of the body 252 of the tensioning device 250. Thickness t2 is measured between the non-contact area tensioner face 257 and the first lateral surface 251 of the body 252 of the tensioning device 250. Thickness t3 is measured between the non-contact area tensioner face 257 and the pivot hole 253. It is noted that the compliance geometry requirement and the applied force tensioner face stiffness requirement of the tensioner face is determined by steps of FIG. 1 described above, along with the radius of curvature of the tensioner face 254. It is also noted that the length of the contact area 256 can vary.

Figure 11:
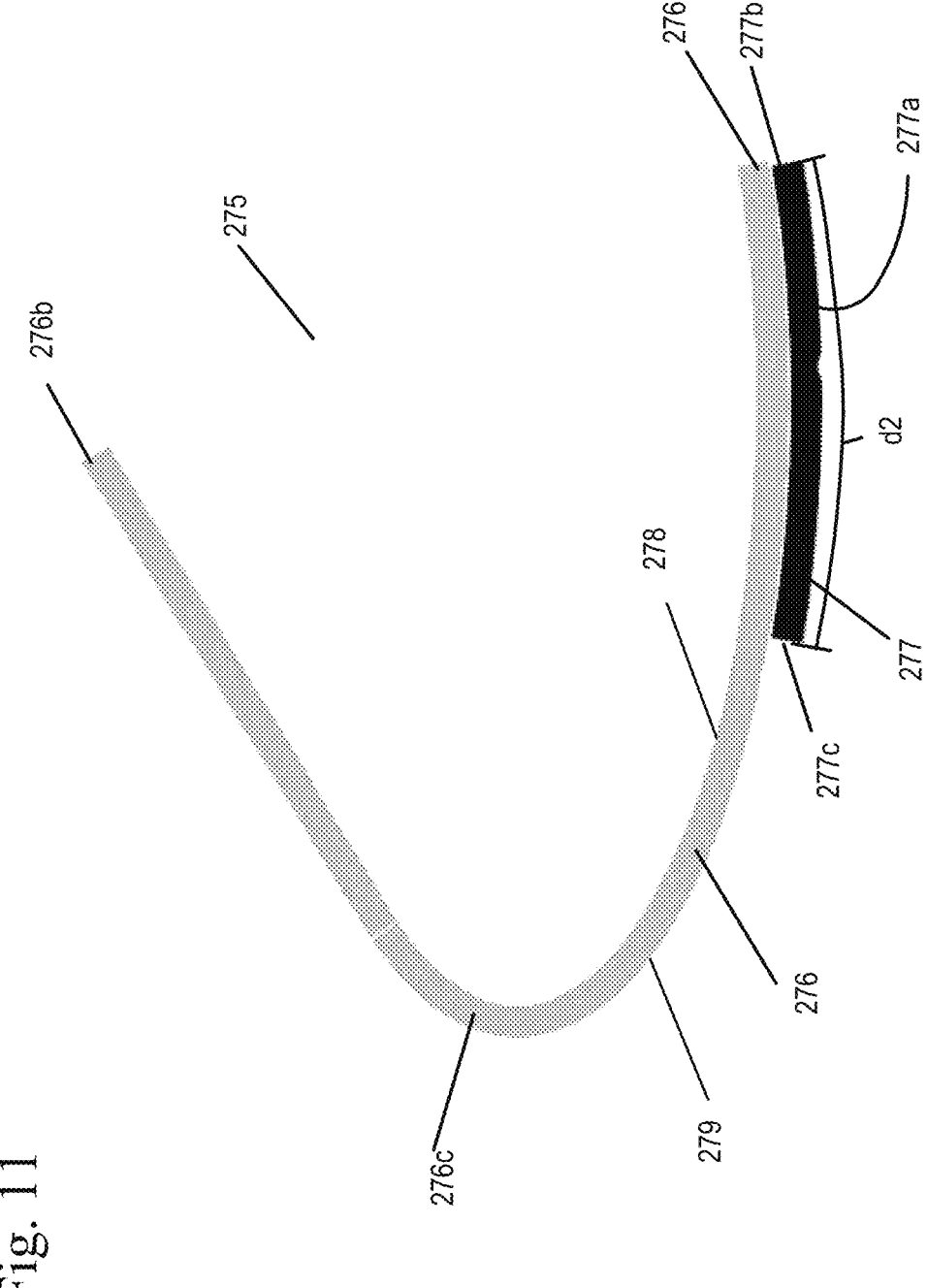
FIG. 11 shows an example of a spring utilized as a tensioning device with an elastomer face.

FIG. 11 shows an example of a spring utilized as a tensioning device with an elastomer face. In this embodiment, a spring 275 has a body 276 with a first end 275a, a second end 275b, a bend 276c between the first end 275a and the second end 275b, a first lateral surface 278 and a second lateral surface 279. An elastomer face 277 is directly attached to the second lateral surface 279 of the spring 275 between the first end 275a and the bend 276c. The elastomer face 277 has a contact area 277a with a distance of d2 between a first end 277b and a second end 277c, greater than or equal to two pitch lengths of a chain in which the tensioning device 275 will engage. The elastomer face 277 can be bonded to second lateral surface 279 or attached via an adhesive. The spring 275 is preferably a blade spring although other springs can be used. The blade spring while shown as being a single blade spring could be comprised of multiple blade springs which act in concert as a single blade spring.

Accordingly, it is to be understood that the embodiments of the invention herein described are merely illustrative of the application of the principles of the invention. Reference herein to details of the illustrated embodiments is not intended to limit the scope of the claims, which themselves recite those features regarded as essential to the invention.

What is claimed is:

1. A method of altering tensioner face compliance to decrease noise, vibration and harshness of a chain system, the chain system comprising:
    a drive sprocket;
    a driven sprocket;

a chain engaging the drive sprocket and the driven sprocket, the chain having a slack strand between the driven sprocket and the driving sprocket and a tight strand between the driven sprocket and the driving sprocket, the chain comprising: a plurality of links connected by connecting elements, each link of the plurality of links comprising a body defining an aperture for receiving at least one connecting element, at least one tooth and a back surface;

at least a first tensioner mounted to interact with the slack strand of the chain, the at least first tensioner comprising a tensioner face which contacts the slack strand of the chain through a tensioner face, such that when the tensioner face is applying a force on the back surface of the plurality of the links of the chain, the tensioner face deforms to a compressed state;

the method comprising:

receiving chain system characteristics of at least: a layout of the chain system, chain system conditions, an initial tensioner face geometry of the at least first tensioner and an applied force of the tensioner face on the chain;

determining a contact length of the tensioner face with the chain to be less than two pitch lengths of the chain;

defining a compliance tensioner face geometry requirement of contact length and tensioner face geometry to obtain a compressed state of the tensioner face with a set amount of compliance;

determining an applied force tensioner face stiffness requirement to obtain the compressed state based on the compliance geometry requirement;

optimizing the compliance geometry requirement and applied force tensioner face stiffness requirement for the tensioner face geometry; and applying the optimized compliance geometry requirement and applied force tensioner face stiffness requirement to the tensioner face geometry to produce a tensioner arm.

2. The method of claim 1, wherein the compliance geometry requirement and applied force tensioner face stiffness requirement is met by a tensioner arm comprising: a body defining a first end, a second end, a pivot hole, a cavity, a first surface, and a tensioner face opposite the first surface; the tensioner face having a radius of curvature extending from the first end to the second end, wherein a portion of the tensioner face is a contact area of at least two pitch lengths which is aligned with the cavity, such that a thickness of the body between the cavity and the contact area of the tensioner face is less than the thickness of the body between the tensioner face and the first surface and the contact area of the tensioner face has a compliance that is less than the tensioner face at surfaces other than the contact area.

3. The method of claim 2, wherein the cavity is filled with an elastomer.

4. The method of claim 2, wherein a blade spring is contained within the cavity.

5. The method of claim 2, wherein a first end of a blade spring is within the cavity, the blade spring extending through the cavity, around the pivot hole, such that a second end of the blade spring extends radially away from the body of the tensioner.

6. The method of claim 2, wherein the thickness between the cavity and the contact area of the tensioner face is less than a thickness between the pivot hole and a non-contact area of the tensioner face.

7. The method of claim 1, wherein the compliance geometry requirement and applied force tensioner face stiffness requirement is met by a tensioner arm comprising: a body defining a first end, a second end, a pivot hole, a first surface, and a tensioner face opposite the first surface; the tensioner face having a radius of curvature extending from the first end to the second end, wherein a portion of the tensioner face is a contact area of at least two pitch lengths at the first end of the body, such that a thickness of the body between the first surface and the contact area of the tensioner face at the first end of the body is less than the thickness of the body between a non-contact area of the tensioner face and the first surface, and the contact area of the tensioner face has a compliance that is less than the tensioner face at surfaces other than the contact area.

8. The method of claim 7, wherein the thickness between the first surface and the contact area of the tensioner face is less than a thickness between the pivot hole and a non-contact area of the tensioner face.

9. The method of claim 1, wherein the system conditions comprises: drive cycle and state of the chain, chain order, frequency and pitch order.

10. The method of claim 1, wherein the initial tensioner face geometry comprises: a stiffness of the tensioner face and a radii of curvature of the tensioner face.

11. The method of claim 1, wherein the system layout comprises: chain type, sprocket tooth profile, chain pitch and center distances between individual chain links of the chain.

12. The method of claim 1, wherein chain pitch length of the chain, the tensioner face geometry of at least an initial face radius geometry, and an applied tensioner force, with the compliance geometry requirement, are used to determine the applied force tensioner face stiffness requirement.

13. The method of claim 1, wherein the compliance geometry requirement and applied force tensioner face stiffness requirement is met by a tensioner arm comprising: a blade spring body defining a first end, a second end, a bend between the first end and the second end, a first surface, and a second surface opposite the first surface; an elastomer face fixedly attached to the second surface, the elastomer having a contact area of at least two pitch lengths.

\* \* \* \* \*